United States Patent
Tang et al.

(10) Patent No.: US 12,531,547 B2
(45) Date of Patent: Jan. 20, 2026

(54) SENSE AMPLIFIER BASED FLIP-FLOP

(71) Applicant: QUALCOMM Incorporated, San Diego, CA (US)

(72) Inventors: Tianyu Tang, San Diego, CA (US); Wei-Yen Chen, Hsinchu (TW); Janus Chiu, Hsinchu (TW); Rui Li, San Diego, CA (US); De Lu, San Diego, CA (US); Venkat Narayanan, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 139 days.

(21) Appl. No.: 18/537,531

(22) Filed: Dec. 12, 2023

(65) Prior Publication Data

US 2025/0192755 A1   Jun. 12, 2025

(51) Int. Cl.
*H03K 3/356* (2006.01)
*H03K 3/012* (2006.01)
*H03K 3/0233* (2006.01)
*H03K 3/037* (2006.01)
*H03K 19/00* (2006.01)
*H03K 19/096* (2006.01)

(52) U.S. Cl.
CPC ........... *H03K 3/0233* (2013.01); *H03K 3/012* (2013.01); *H03K 3/037* (2013.01); *H03K 19/0016* (2013.01); *H03K 19/0963* (2013.01)

(58) Field of Classification Search
CPC ...... H03K 3/0233; H03K 3/012; H03K 3/037; H03K 3/35625; H03K 3/356139; H03K 19/0016
See application file for complete search history.

(56) References Cited

U.S. PATENT DOCUMENTS

| 6,400,199 | B1 | 6/2002 | Liu et al. | |
|---|---|---|---|---|
| 11,789,075 | B1* | 10/2023 | Baksh | G01R 31/3177 |
| | | | | 714/731 |
| 2002/0140480 | A1 | 10/2002 | Lu et al. | |
| 2003/0062939 | A1* | 4/2003 | Tanaka | H03K 3/35625 |
| | | | | 327/202 |

(Continued)

OTHER PUBLICATIONS

Partial International Search Report—PCT/US2024/051425—ISA/EPO—Feb. 3, 2025.

(Continued)

*Primary Examiner* — Sibin Chen

(74) *Attorney, Agent, or Firm* — Loza & Loza, LLP

(57) ABSTRACT

A system includes a first sense amplifier having a first data input, a second data input, a clock input configured to receive a first clock signal, a first output, and a second output. The system also includes a second sense amplifier having a first data input, a second data input, a clock input configured to receive a second clock signal, a first output, and a second output. The first data input of the second sense amplifier is coupled to the first data input of the first sense amplifier, and the second data input of the second sense amplifier is coupled to the second data input of the first sense amplifier. The system also includes a set-reset (S-R) latch coupled to the first output and the second output of the first sense amplifier, and coupled to the first output and the second output of the second sense amplifier.

15 Claims, 16 Drawing Sheets

(56) References Cited

U.S. PATENT DOCUMENTS

| | | | |
|---|---|---|---|
| 2007/0096957 A1* | 5/2007 | Papaefthymiou | ............................ H03K 3/356139 341/51 |
| 2009/0058476 A1* | 3/2009 | Oh | ........................ H04L 7/0337 327/144 |
| 2019/0267981 A1* | 8/2019 | Chan | ..................... H02M 3/158 |

OTHER PUBLICATIONS

International Search Report and Written Opinion—PCT/US2024/051425—ISA/EPO—Apr. 16, 2025.

* cited by examiner

SENSE AMPLIFIER BASED FLIP-FLOP

BACKGROUND

Field

Aspects of the present disclosure relate generally to flip-flops, and, more particularly, to sense amplifier based flip-flops.

Background

A system (e.g., a processor) may include sequential circuits (sometimes referred to as sequential logic) where each sequential circuit includes flip-flops. For example, flip-flops may be used to move data through a data path in a sequential circuit, in which the movement of the data through the data path is timed based on a clock signal input to the flip-flops.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a first sense amplifier having a first data input, a second data input, a clock input, a first output, and a second output, wherein the clock input of the first sense amplifier is configured to receive a first clock signal. The system also includes a second sense amplifier having a first data input, a second data input, a clock input, a first output, and a second output, wherein the clock input of the second sense amplifier is configured to receive a second clock signal, the first data input of the second sense amplifier is coupled to the first data input of the first sense amplifier, and the second data input of the second sense amplifier is coupled to the second data input of the first sense amplifier. The system also includes a set-reset (S-R) latch having a first set input, a second set input, a first reset input, a second reset input, and an output, wherein the first set input is coupled to the first output of the first sense amplifier, the second set input is coupled to the first output of the second sense amplifier, the first reset input is coupled to the second output of the first sense amplifier, and the second reset input is coupled to the second output of the second sense amplifier.

A second aspect relates to a method. The method includes receiving a first data signal and a second data signal, during a first portion of a cycle of a clock signal, generating first complementary logic values based on the first data signal and the second data signal using a first sense amplifier, outputting the first complementary logic values to a set-reset (S-R) latch, during a second portion of the cycle of the clock signal, generating second complementary logic values based on the first data signal and the second data signal using a second sense amplifier, and outputting the second complementary logic values to the S-R latch.

A third aspect relates to a system. The system includes a sense amplifier having a first data input, a second data input, a first scan input, and second scan input. The sense amplifier includes a latch having a first input, a second input, a first output, and a second output. The sense amplifier also includes a first transistor, wherein a gate of the first transistor is coupled to the first data input of the sense amplifier, and a drain of the first transistor is coupled to the first input of the latch. The sense amplifier also includes a second transistor, wherein a gate of the second transistor is coupled to the second data input of the sense amplifier, and a drain of the second transistor is coupled to the second input of the latch. The sense amplifier also includes a third transistor, wherein a gate of the third transistor is coupled to the first scan input of the sense amplifier, and a drain of the third transistor is coupled to the first input of the latch. The sense amplifier further includes a fourth transistor, wherein a gate of the fourth transistor is coupled to the second can input of the sense amplifier, and a drain of the fourth transistor is coupled to the second input of the latch. The system also includes a set-reset (S-R) latch having a set input, a reset input, and an output, wherein the set input is coupled to the first output of the latch, and the reset input is coupled to the second output of the latch.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
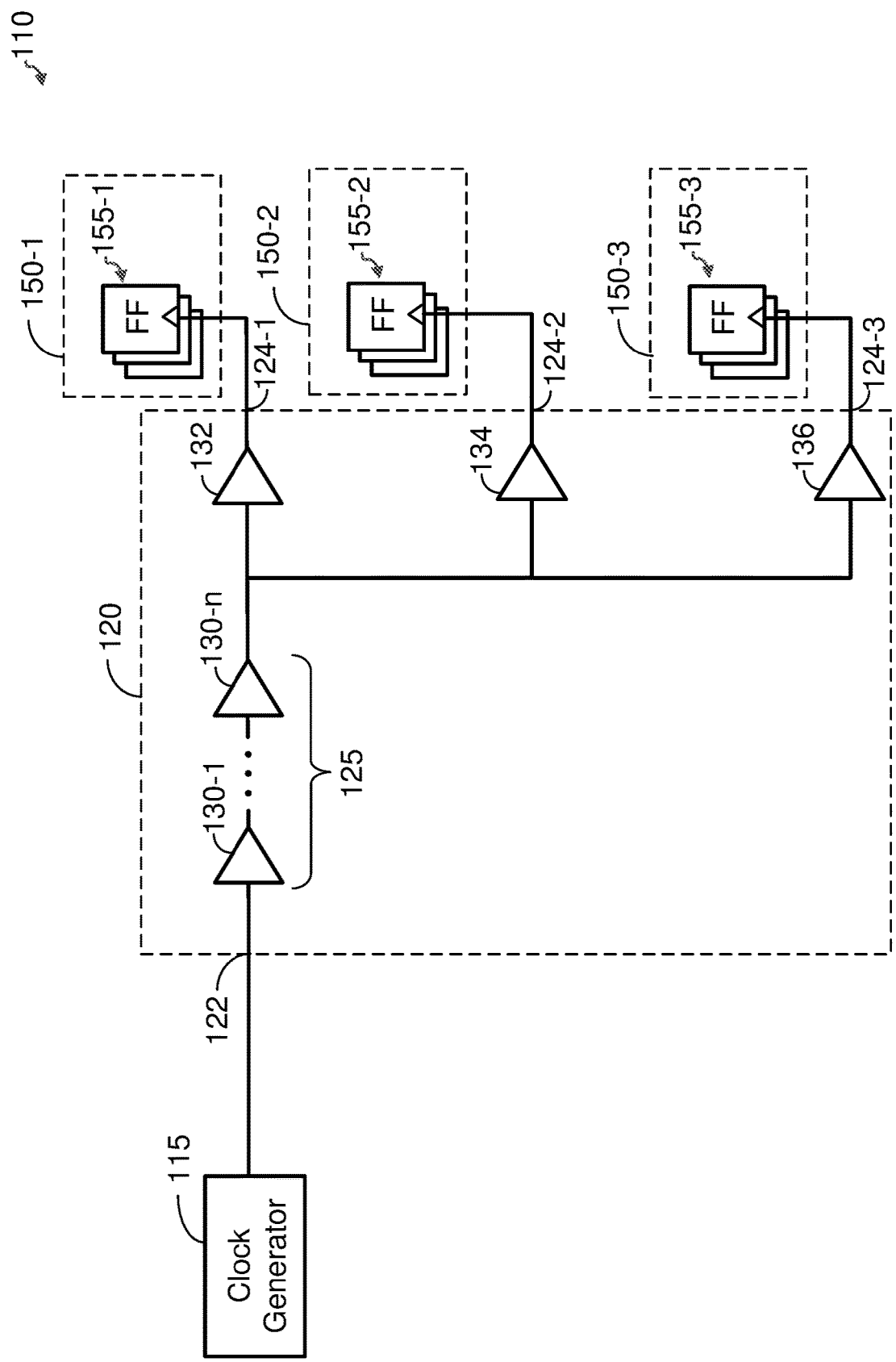
FIG. 1 shows an example of a system including a clock network and flip-flops according to certain aspects of the present disclosure.

FIG. 1 shows an example of a system 110 in which aspects of the present disclosure may be used. The system 110 may be implemented in an integrated circuit (IC), such as a system on a chip (SOC). In this example, the system 110 includes a clock generator 115, a clock network 120, and multiple circuits 150-1 to 150-3 (e.g., sequential circuits).

The clock generator 115 is configured to generate a clock signal for timing operations of the circuits 150-1 to 150-3. The clock generator 115 may be implemented with a phase-locked loop (PLL) or another type of clock generator 115. The clock network 120 (also referred to as a clock tree, a clock distribution network, or another term) is configured to distribute the clock signal from the clock generator 115 to the circuits 150-1 to 150-3. A clock signal, as defined herein, is a substantially periodic voltage waveform (e.g., substantially square wave), which may be used for timing the operations of circuits.

In the example shown in FIG. 1, each of the circuits 150-1 to 150-3 includes respective flip-flops 155-1 to 155-3, which are clocked by the clock signal. For example, some or all of the flip-flops 155-1 in the circuit 150-1 may by placed along a data path in the circuit 150-1 to time the movement of data through the data path based on the clock signal. It is to be appreciated that the circuits 150-1 to 150-3 may include other devices (e.g., logic gates, combinational logic, etc.) in addition to the flip-flops 155-1 to 155-3. For example, the circuit 150-1 may include a functional block (e.g., combinational logic, an arithmetic logic unit, a register, etc.) in which some or all of the flip-flops 155-1 are used to move input data into the functional block and move output data out of the functional block. It is to be appreciated that the above examples may also apply to the other circuits 150-2 and 150-3.

In this example, the clock generator 115 is coupled to an input 122 of the clock network 120, and each of the circuits 150-1 to 150-3 is coupled to a respective output 124-1 to 124-3 of the clock network 120. The clock network 120 receives the clock signal from the clock generator 115 via the input 122 (also referred to as a root node) and distributes the clock signal to the circuits 150-1 to 150-3 via the outputs 124-1 to 124-3 (also referred to as leaf nodes).

In the example shown in FIG. 1, the clock network 120 includes a clock path 125 and clock buffers 132, 134, and 136. The clock path 125 includes clock buffers 130-1 to 130-n coupled in series. The clock buffers 130-130-n, 132, 134, and 136 may be used, for example, to isolate the clock generator 115 from the loads of the circuits 150-1 to 150-3 and/or help propagate the clock signal through the clock network 120.

It is to be appreciated that the clock network 120 may include additional clock buffers and/or other components not shown in FIG. 1. For example, the clock network 120 may include one or more clock gating circuits (also referred to as clock gating cells) to gate the clock signal when the circuits 150-1 to 150-3 are idle to reduce dynamic power consumption when the circuits 150-1 to 150-3 are idle. A clock path, as defined herein, is a path through which a clock signal propagates, and may include one or more clock buffers and/or one or more other components.

Figure 2:
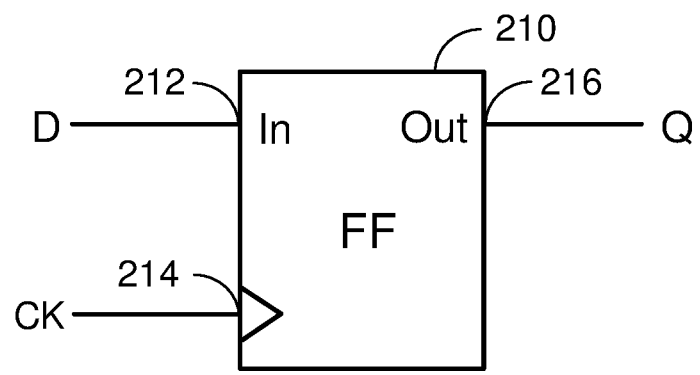
FIG. 2 shows an example of a single-edge-triggered flip-flop according to certain aspects of the present disclosure.

FIG. 2 shows an example of a flip-flop 210 according to certain aspects. In this example, the flip-flop 210 is a single-edge-triggered flip-flop that latches one data bit per cycle of a clock signal CK.

In the example in FIG. 2, the flip-flop 210 is positive edge triggered (i.e., the flip-flop 210 latches a data bit on a rising edge of the clock signal during each cycle of the clock signal CK). The flip-flop 210 has an input 212, an output 216, and a clock input 214. The input 212 may be coupled to a data path to receive a data signal, and the clock input 214 may be coupled to a clock path (e.g., the clock path 125) to receive the clock signal CK. The output 216 may be coupled to another flip-flop and/or logic (e.g., combinational logic) located downstream of the flip-flop 210. During each clock cycle, the flip-flop 210 latches a data bit at the input 212 on a rising edge of the clock signal CK, and outputs the latched data bit at the output 216 until the next rising edge of the clock signal CK.

Figure 3:
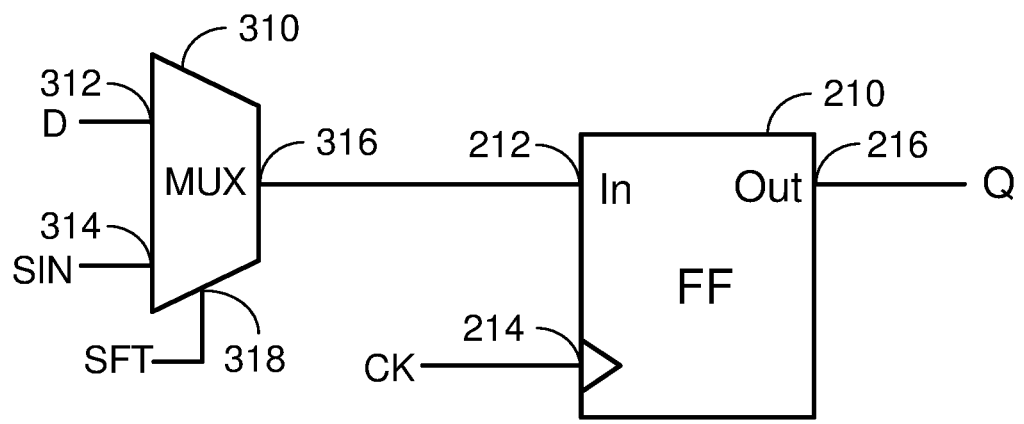
FIG. 3 shows an example of a multiplexer configured to selectively couple the single-edge-triggered flip-flop of FIG. 2 to a data input or a scan input according to certain aspects of the present disclosure.

FIG. 3 shows an example in which a multiplexer 310 is coupled to the input 212 of the flip-flop 210 to support design-for-testability (DFT) of a circuit that includes the flip-flop 210, as discussed further below. In this example, the multiplexer 310 has a data input 312, a scan input 314, a select input 318, and an output 316 coupled to the input 212 of the flip-flop 210. The data input 312 is coupled to the data path discussed above to receive the data signal. The data path may also be referred to as a functional path.

The flip-flop 210 may be one of multiple flip-flops coupled in a scan chain (not shown) to support DFT. In this example, the scan input 314 may be coupled to the input of the scan chain or a preceding flip-flop in the scan chain. The output 216 of the flip-flop 210 may be coupled to the output of the scan chain or a subsequent flip-flop in the scan chain. Alternately, the flip-flop 210 may have a separate scan output (not shown) coupled the output of the scan chain or the subsequent flip-flop in the scan chain. In this example, the scan chain may be configured to receive an input test vector (e.g., sequence of input test bits) and output a corresponding output test vector (e.g., sequence of output test bits). The output test vector may be compared with an expected output test vector to verify that the circuit is functioning properly.

In this example, the multiplexer 310 is configured to select the data input 312 or the scan input 314 based on a shift control signal (SFT) received at the select input 318. In a functional mode, the shift control signal causes the multiplexer 310 to select the data input 312. In this mode, the input 212 of the flip-flop 210 is coupled to the data path and operates in the manner discussed above with reference to FIG. 2. In a scan mode, the shift control signal causes the multiplexer 310 to select the scan input 314. In this mode, the input 212 of the flip-flop 210 is coupled to the input of the scan chain or the preceding flip-flop in the scan chain.

Figure 4:
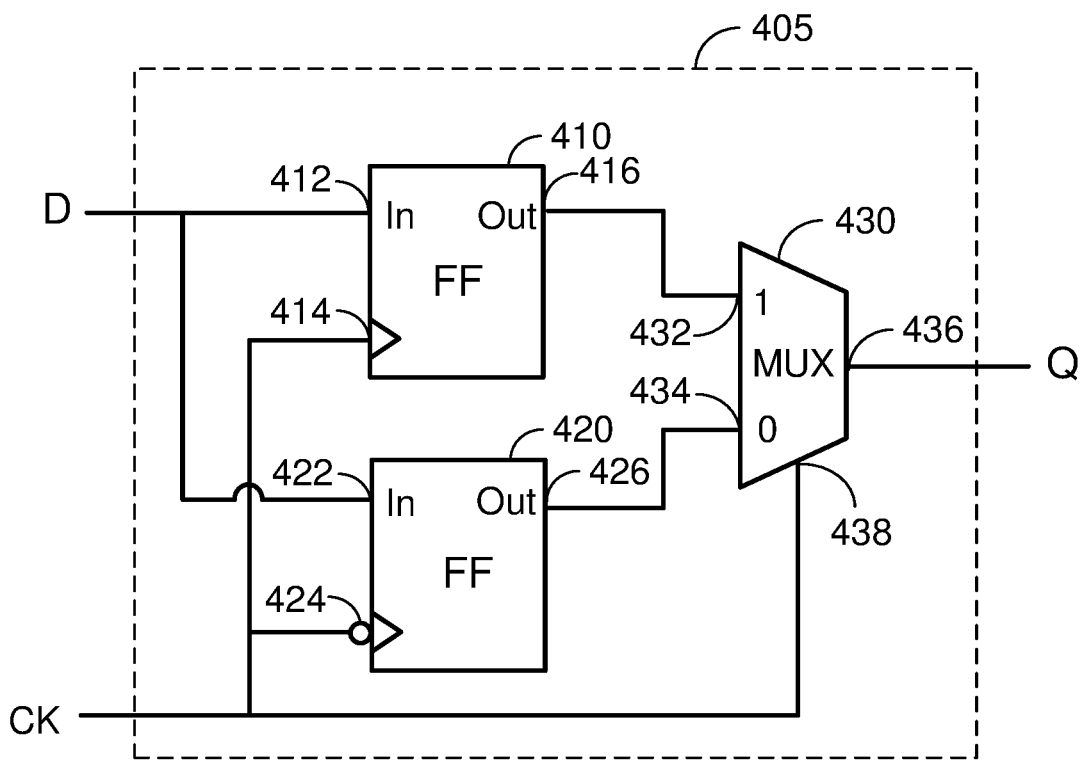
FIG. 4 shows an example of a dual-edge-triggered flip-flop according to certain aspects of the present disclosure.

FIG. 4 shows an example of a dual-edge-triggered flip-flop 405 that latches data on both edges of the clock signal CK. More particularly, during each cycle of the clock signal CK, the dual-edge-triggered flip-flop 405 latches a first data bit on a rising edge of the clock signal CK and latches a second data bit on a falling edge of the clock signal CK. An advantage of the dual-edge-triggered flip-flop 405 is that the dual-edge-triggered flip-flop 405 allows the frequency of the clock signal CK to be reduced by half while maintaining the same data throughput as the flip-flop 210 in FIG. 2. Reducing the frequency of the clock signal CK by half reduces the frequency of switching in the clock network (e.g., the clock network 120) by half, which translates into a reduction in power consumption. A dual-edge-triggered flip-flop may also be referred to as a double-edge-triggered flip-flop or another term.

In the example in FIG. 4, the dual-edge-triggered flip-flop 405 includes a first single-edge-triggered flip-flop 410, a second single-edge-triggered flip-flop 420, and a multiplexer 430. The first single-edge-triggered flip-flop 410 has an input 412, a clock input 414, and an output 416. The second single-edge-triggered flip-flop 420 has an input 422, a clock input 424, and an output 426. The inputs 412 and 422 of the flip-flops 410 and 420 are coupled to the data path to receive the data signal. The clock inputs 414 and 424 of the flip-flops 410 and 420 receive the clock signal CK (e.g., from the clock network 120).

The first single-edge-triggered flip-flop 410 is positive edge triggered and the second single-edge-triggered flip-flop 420 is negative edge triggered. In other words, the first single-edge-triggered flip-flop 410 is configured to latch a data bit at the input 412 on a rising edge of the clock signal during each cycle of the clock signal CK, and output the latched data bit at the output 416. The second single-edge-triggered flip-flop 420 is configured to latch a data bit on a falling edge of the clock signal during each cycle of the clock signal CK, and output the latched data bit at the output 426. Thus, in this example, the dual-edge-triggered flip-flop 405 is implemented using two single-edge-triggered flip-flops (i.e., the first single-edge-triggered flip-flop 410 and the second single-edge-triggered flip-flop 420) where one of the single-edge-triggered flip-flops is positive edge triggered and the other one of the single-edge-triggered flip-flops is negative edge triggered.

The multiplexer 430 has a first input 432, a second input 434, a select input 438, and an output 436. The first input 432 is coupled to the output 416 of the first single-edge-triggered flip-flop 410, the second input 434 is coupled to the output 426 of the second single-edge-triggered flip-flop 420, and the output 436 provides the output of the dual-edge-triggered flip-flop 405. The select input 438 receives the clock signal CK. Thus, the multiplexer 430 selects the first input 432 or the second input 434 based on the clock signal CK. In this example, the multiplexer 430 selects the first input 432 (and hence the output 416 of the first single-edge-triggered flip-flop 410) when the clock signal CK is high (i.e., logic one), and selects the second input 434 (and hence the output 426 of the second single-edge-triggered flip-flop 420) when the clock signal CK is low (i.e., logic zero).

During each cycle of the clock signal CK, the first single-edge-triggered flip-flop 410 latches a first data bit on a rising edge of the clock signal CK and outputs the latched first data bit to the multiplexer 430. Since the clock signal CK goes high, the multiplexer 430 selects the first input 432 and propagates the latched first data bit to the output of the dual-edge-triggered flip-flop 405. The second single-edge-triggered flip-flop 420 latches a second data bit on a falling edge of the clock signal CK and outputs the latched second data bit to the multiplexer 430. Since the clock signal CK goes low, the multiplexer 430 selects the second input 434 and propagates the latched second data bit to the output of the dual-edge-triggered flip-flop 405.

Figure 5:
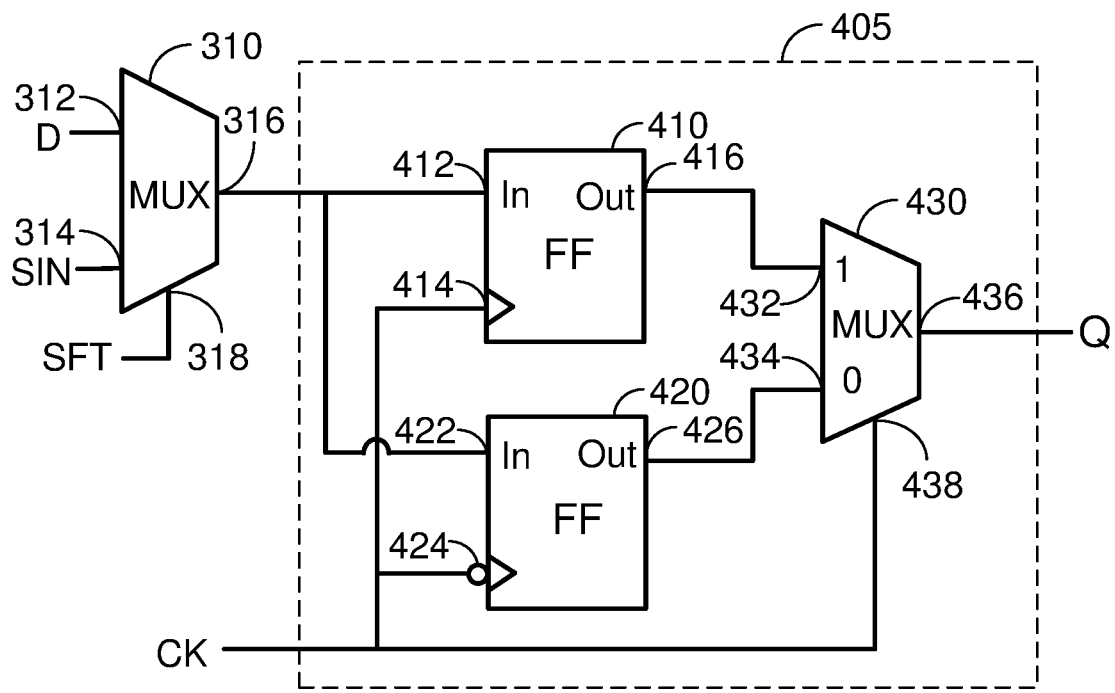
FIG. 5 shows an example of a multiplexer configured to selectively couple the dual-edge-triggered flip-flop of FIG. 4 to a data input or a scan input according to certain aspects of the present disclosure.

FIG. 5 shows an example in which the multiplexer 310 of FIG. 3 is coupled to the input of the dual-edge-triggered flip-flop 405 to support DFT according to certain aspects. In the functional mode, the multiplexer 310 couples the input of the dual-edge-triggered flip-flop 405 to the data path. In the scan mode, the multiplexer 310 couples the input of the dual-edge-triggered flip-flop 405 to the input of the scan chain or the preceding flip-flop in the scan chain, as discussed above.

Figure 6:
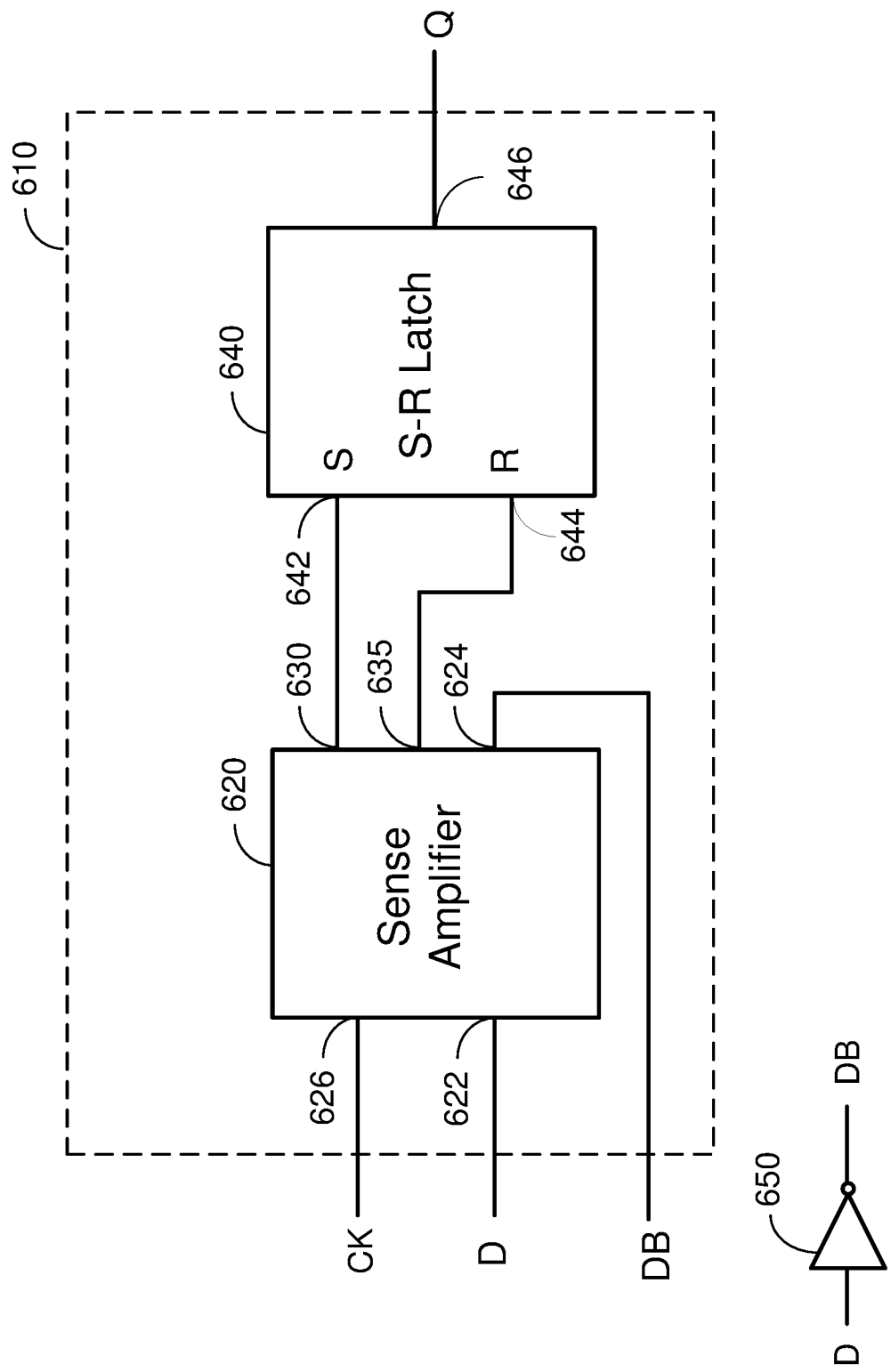
FIG. 6 shows an example of a sense amplifier based flip-flop according to certain aspects of the present disclosure.

FIG. 6 shows an example of a flip-flop 610 according to certain aspects of the present disclosure. The flip-flop 610 is a sense amplifier based flip-flop including a sense amplifier 620 and a set-reset (S-R) latch 640.

The sense amplifier 620 has a first data input 622, a second data input 624, a clock input 626, a first output 630, and a second output 635. The clock input 626 receives the clock signal CK (e.g., from the clock network 120). The first data input 622 receives a first data signal (labeled "D") and the second data input 624 receives a second data signal (labeled "DB"). In certain aspects, the second data signal may be a complement (i.e., inverse) of the first data signal. In one example, the first data input 622 may be coupled to the data path discussed above, and the second data input 624 may be coupled to the data path through an inverter 650, which converts the first data signal into the second data signal (e.g., the complement of the first data signal).

The S-R latch 640 has a set input 642, a reset input 644, and an output 646. The set input 642 is coupled to the first output 630 of the sense amplifier 620, and the reset input 644 is coupled to the second output 635 of the sense amplifier 620. The output 646 of the S-R latch 640 provides the output (labeled "Q") of the flip-flop 610. In this example, the S-R latch 640 may be configured to output a one at the output 646 when the set input 642 is one and the reset input 644 is zero, and output a zero at the output 646 when the set input 642 is zero and the reset input 644 is one. The S-R latch 640 may also be configured to hold the current logic value at the output 646 when the set input 642 and the reset input 644 are both one. However, it is to be appreciated that the present disclosure is not limited to this example.

In operation, the sense amplifier 620 is clocked by the clock signal CK. During each cycle of the clock signal CK, the sense amplifier 620 pre-charges the outputs 630 and 635 during a pre-charge phase, and generates complementary logic values at the outputs 630 and 635 during an evaluation phase based on the first data signal and the second data signal. During each clock cycle, the pre-charge phase may occur when the clock signal CK is low (e.g., logic zero), and the evaluation phase may occur when the clock signal CK is high (i.e., logic one). However, it is to be appreciated that the present disclosure is not limited to this example.

During the pre-charge phase, the sense amplifier 620 may pre-charge the outputs 630 to 635 to voltages approximately equal to a supply voltage Vdd, which corresponds to logic one. As a result, the first output 630 outputs a logic one to the set input 642 of the S-R latch 640, and the second output 635 outputs a logic one to the reset input 644 of the S-R latch 640. This causes the S-R latch 640 to hold the current logic value at the output 646 during the pre-charge phase in this example. However, it is to be appreciated that the present disclosure is not limited to this example.

During the evaluation phase (also referred to as the compare phase), the sense amplifier 620 outputs complementary logic values to the S-R latch 640 based on the first data signal and the second data signal. The complementary logic values include a logic one (e.g., a voltage approximately equal to the supply voltage Vdd) and a logic zero (e.g., a voltage approximately equal to ground potential). For example, the sense amplifier 620 may output a logic one at the first output 630 and output a logic zero at the second output 635 when the voltage of the first data signal is greater than the voltage of the second data signal. In this case, the set input 642 of the S-R latch 640 is one and the reset input 644 of the S-R latch 640 is zero, which causes the S-R latch 640 to output a one at the output 646. The sense amplifier 620 may output logic zero at the first output 630 and output a one at the second output 635 when the voltage of the second data signal is greater than the voltage of the first data signal. In this case, the set input 642 of the S-R latch 640 is zero and the reset input 644 of the S-R latch 640 is one, which causes the S-R latch 640 to output a zero at the output 646.

The sense amplifier 620 is able to quickly convert a small voltage difference between the first data signal (labeled "D") and the second data signal (labeled "DB") into complementary logic values at the outputs 630 and 635. This allows the flip-flop 610 to achieve high-speed operation at relatively low power compared with other types of flip-flops.

Figure 7A:
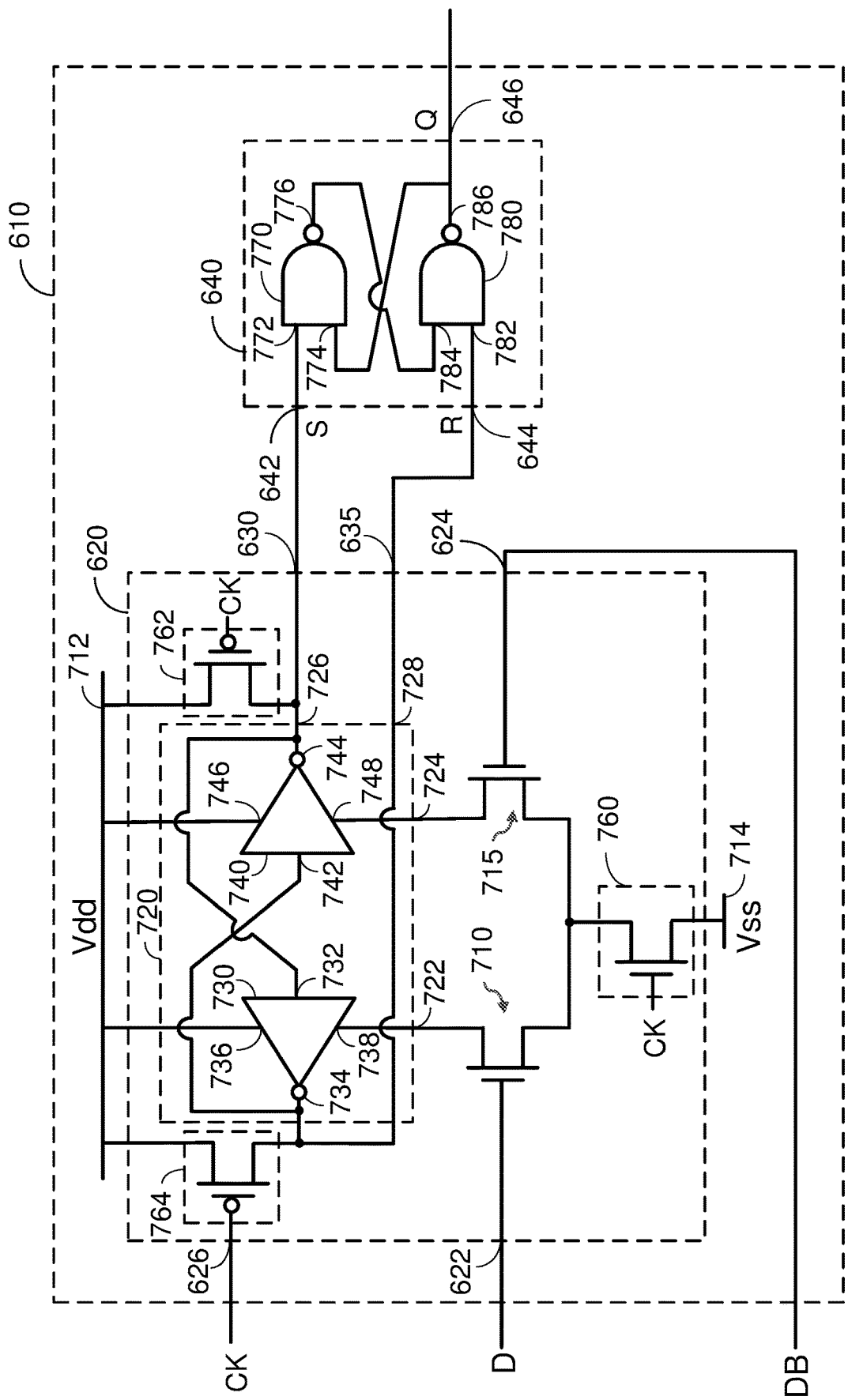
FIG. 7A shows an exemplary implementation of a sense amplifier and a set-reset (S-R) latch according to certain aspects of the present disclosure.

FIG. 7A shows an exemplary implementation of the sense amplifier 620 and the S-R latch 640 according to certain aspects. In this example, the sense amplifier 620 includes a latch 720, a first transistor 710, and a second transistor 715. The latch 720 has a first input 722, a second input 724, a first output 726, and a second output 728. The first output 726 of the latch 720 is coupled to the first output 630 of the sense amplifier 620, and the second output 728 of the latch 720 is coupled to the second output 635 of the sense amplifier 620. As discussed further below, during the evaluation phase, the latch 720 is driven into one of two states by the first transistor 710 and the second transistor 715.

In the example in FIG. 7A, the drain of the first transistor 710 is coupled to the first input 722 of the latch 720, and the gate of the first transistor 710 is coupled to the first data input 622 of the sense amplifier 620 to receive the first data signal. The drain of the second transistor 715 is coupled to the second input 724 of the latch 720, and the gate of the second transistor 615 is coupled to the second data input 624 of the sense amplifier 620 to receive the second data signal. Thus, in this example, the first transistor 710 is driven by the first data signal (labeled "D"), and the second transistor 715 is driven by the second data signal (labeled "DB"). In the example shown in FIG. 7A, each of the first transistor 710 and the second transistor 715 is implemented with a respective NFET. However, it is to be appreciated that the present disclosure is not limited to this example.

In the example in FIG. 7A, the latch 720 includes a first inverter 730 and a second inverter 740. The first inverter 730 and the second inverter 740 are cross-coupled in which the output 734 of the first inverter 730 is coupled to the input 742 of the second inverter 740, and the output 744 of the second inverter 740 is coupled to the input 732 of the first inverter 730. The output 744 of the second inverter 740 is coupled to the first output 726 of the latch 720 (which is coupled to the first output 630 of the sense amplifier 620), and the output 734 of the first inverter 730 is coupled to the second output 728 of the latch 720 (which is coupled to the second output 635 of the sense amplifier 620).

The first inverter 730 has a first supply terminal 736 and a second supply terminal 738. In the example shown in FIG. 7A, the first supply terminal 736 is an upper supply terminal (also referred to as a power terminal) coupled to a voltage supply rail 712 to receive a supply voltage Vdd, and the second supply terminal 738 is a low supply terminal, which is at a lower potential than the upper supply terminal. The second supply terminal 738 is coupled to the first input 722 of the latch 720, which is driven by the first transistor 710. However, it is to be appreciated that the present disclosure is not limited to this example.

The second inverter 740 has a first supply terminal 746 and a second supply terminal 748. In the example shown in FIG. 7A, the first supply terminal 746 is an upper supply terminal (also referred to as a power terminal) coupled to the voltage supply rail 712 to receive the supply voltage Vdd, and the second supply terminal 748 is a low supply terminal, which is at a lower potential than the upper supply terminal. The second supply terminal 748 is coupled to the second input 724 of the latch 720, which is driven by the second transistor 715. However, it is to be appreciated that the present disclosure is not limited to this example.

The sense amplifier 620 may also include switches driven by the clock signal CK to switch the sense amplifier 620 between the pre-charge phase and the evaluation phase. In the example in FIG. 7A, the switches include a first switch 760, a second switch 762, and third switch 764. The first switch 760 is coupled between the sources of the first and second transistors 710 and 715 and a low rail 714 (e.g., ground rail), which has a lower potential than the voltage supply rail 712. The second switch 762 is coupled between the voltage supply rail 712 and the first output 726 of the latch 720, and the third switch 764 is coupled between the voltage supply rail 712 and the second output 728 of the latch 720. In the example in FIG. 7A, the first switch 760 is implemented with an NFET, and each of the second switch 762 and the third switch 764 is implemented with a PFET. Thus, in this example, the first switch 760 is turned on (i.e., closed) when the clock signal CK is high and turned off (i.e., open) when the clock signal CK is low, and each of the second switch 762 and the third switch 764 is turned on (i.e., closed) when the clock signal CK is low and turned off (i.e., open) when the clock signal CK is high.

Exemplary operations of the example implementation of the sense amplifier 620 shown in FIG. 7A will now be discussed according to certain aspects.

During the pre-charge phase, the clock signal CK (which is low) turns off the first switch 760, which decouples the sources of the first and second transistors 710 and 715 from the low rail 714 (e.g., ground rail). The clock signal CK also turns on the second switch 762 and the third switch 764. As a result, the first output 630 is pre-charged to approximately Vdd through the second switch 762, and the second output 635 is pre-charged to approximately Vdd through the third switch 764. Thus, in this example, the first output 630 and the second output 635 are pre-charged to approximately the supply voltage Vdd during the pre-charge phase.

During the evaluation phase, the clock signal CK (which is high) turns off the second switch 762 and the third switch 764. The clock signal CK also turns on the first switch 760, which couples the sources of the first transistor 710 and the second transistor 715 to the low rail 714 (e.g., ground rail) through the first switch 760. This allows the first transistor 710 and the second transistor 715 to drive the first input 722 and the second input 724, respectively, of the latch 720 based on the first data signal and the second data signal, respectively.

When the voltage of the first data signal is higher than the voltage of the second data signal, the first transistor 710 pulls down the voltage at the first input 722 of the latch 720 at a faster rate than the second transistor 715 pulls down the voltage at the second input 724 of the latch 720. This cause the output 734 of the first inverter 730 to quickly go low (e.g., approximately ground potential) and the output 744 of the second inverter 740 to quickly go high (e.g., approximately Vdd) due to the cross-coupling of the inverters 730 and 740 (which provides positive feedback). As a result, the first output 726 of the latch 720 (and hence the first output 630 of the sense amplifier 620) is logic one and the second output 728 of the latch 720 (and hence the second output 635 of the sense amplifier 620) is logic zero in this case.

When the voltage of the second data signal is higher than the voltage of the first data signal, the second transistor 715 pulls down the voltage at the second input 724 of the latch 720 at a faster rate than the first transistor 710 pulls down the voltage at the first input 722 of the latch 720. This cause the output 744 of the second inverter 740 to quickly go low (e.g., approximately ground potential) and the output 734 of the first inverter 730 to quickly go high (e.g., approximately Vdd) due to the cross-coupling of the inverters 730 and 740 (which provides positive feedback). As a result, the first output 726 of the latch 720 (and hence the first output 630 of the sense amplifier 620) is logic zero and the second output 728 of the latch 720 (and hence the second output 635 of the sense amplifier 620) is logic one in this case.

Thus, in the example implementation shown in FIG. 7A, the sense amplifier 620 outputs a one (e.g., approximately Vdd) at the first output 630 and outputs a zero (e.g., approximately ground potential) at the second output 635 during the evaluation phase when the voltage of the first data signal is higher than the voltage of the second data signal. The sense amplifier 620 outputs a zero (e.g., approximately ground potential) at the first output 630 and outputs a one (e.g., approximately Vdd) at the second output 635 during the evaluation phase when the voltage of the second data signal is higher than the voltage of the first data signal.

In the example in FIG. 7A, the S-R latch 640 includes a first NAND gate 770 and a second NAND gate 780. The first NAND gate 770 has a first input 772, a second input 774, and an output 776. The second NAND gate 780 has a first input 782, a second input 784, and an output 786. The first input 772 of the first NAND gate 770 is coupled to the set input 642 of the S-R latch 640, and the first input 782 of the second NAND gate 780 is coupled to the reset input of the S-R latch 640. The output 776 of the first NAND gate 770 is coupled to the second input 784 of the second NAND gate 780, and the output 786 of the second NAND gate 780 is coupled to the second input 774 of the first NAND gate 770. The output 786 of the second NAND gate 780 is also coupled to the output 646 of the S-R latch 640. However, it is to be appreciated that the present disclosure is not limited to this example. In other implementations, the output 646 of the S-R latch 640 may be coupled to the output 776 of the first NAND gate 770. In other implementations, the S-R latch 640 may include complementary outputs where one of the outputs is coupled to the output 786 of the second NAND gate 780 and the other one of the outputs is coupled to the output 776 of the first NAND gate 770.

The S-R latch 640 outputs a one at the output 646 when the set input 642 is one and the reset input 644 is zero, and outputs a zero at the output 646 when the set input is zero and the reset input 644 is one. In this example, the S-R latch 640 holds the current logic value at the output 646 when the set input 642 and the reset input 644 are both one. Thus, during the pre-charge phase, the S-R latch 640 holds the logic value from the previous evaluation phase in this example. It is to be appreciated that the S-R latch 640 is not limited to this example. For example, it is to be appreciated that the S-R latch 640 is not limited to NAND gates and that the S-R latch 640 may be implemented with other types of logic gates in other implementations.

Figure 7B:
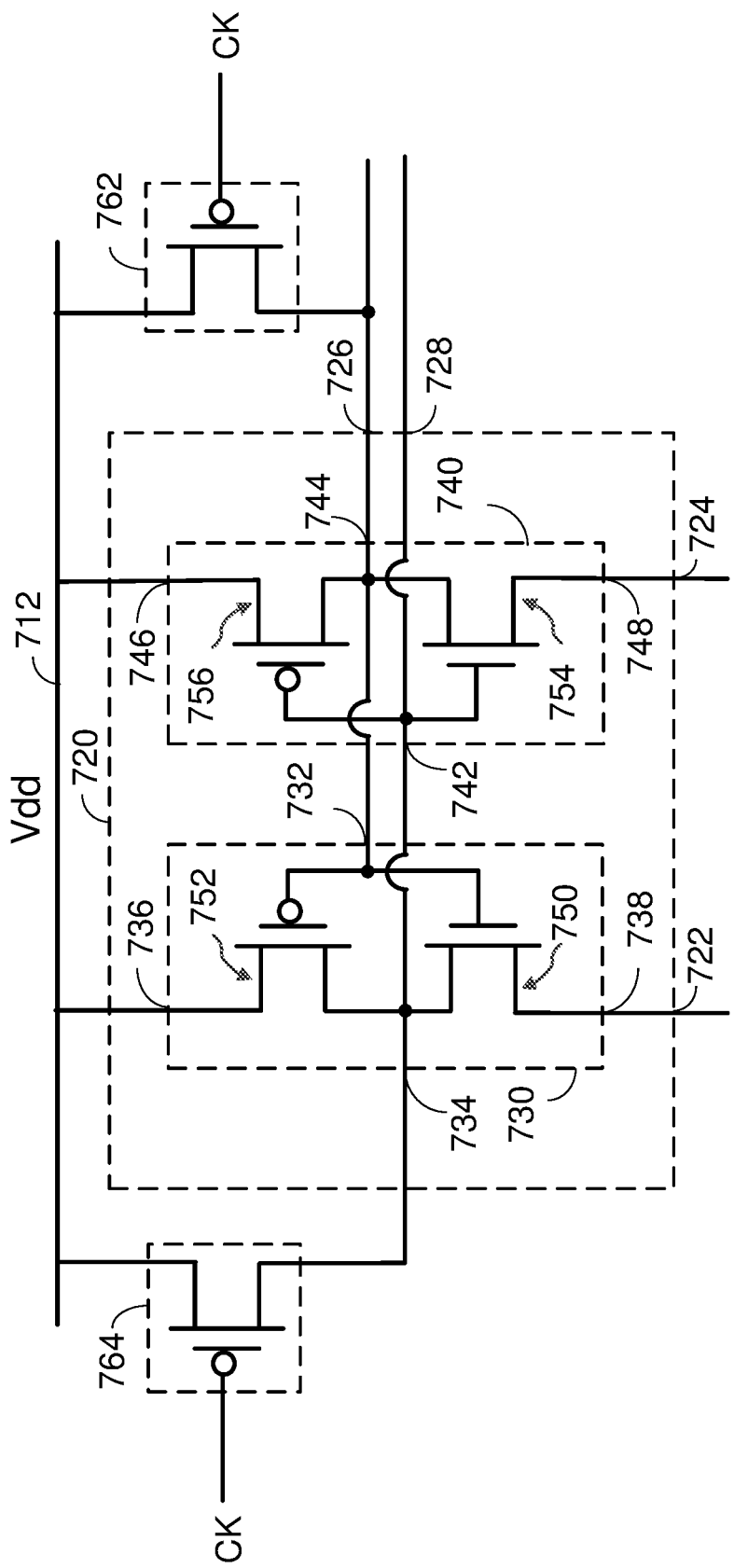
FIG. 7B shows an exemplary implementation of a first inverter and a second inverter according to certain aspects of the present disclosure.

Each of the first inverter 730 and the second inverter 740 may be implemented with a respective complementary inverter (e.g., respective complementary metal-oxide-semiconductor (CMOS) inverter). In this regard, FIG. 7B shows an exemplary implementation of the first inverter 730 and the second inverter 740 according to certain aspects. In this example, the first inverter 730 includes a first NFET 750 and a first PFET 752. The source of the first PFET 752 is coupled to the first supply terminal 736, the gate of the first PFET 752 is coupled to the input 732, and the drain of the first PFET 752 is coupled to the output 734. The source of the first NFET 750 is coupled to the second supply terminal 738, the gate of the first NFET 750 is coupled to the input 732, and the drain of the first NFET 750 is coupled to the output 734. The second inverter 740 includes a second NFET 754 and a second PFET 756. The source of the second PFET 756 is coupled to the first supply terminal 746, the gate of the second PFET 755 is coupled to the input 742, and the drain of the second PFET 756 is coupled to the output 744. The source of the second NFET 754 is coupled to the second supply terminal 748, the gate of the second NFET 754 is coupled to the input 742, and the drain of the second NFET 754 is coupled to the output 744. However, it is to be appreciated that the first inverter 730 and the second inverter 740 are not limited to this example.

Figure 8:
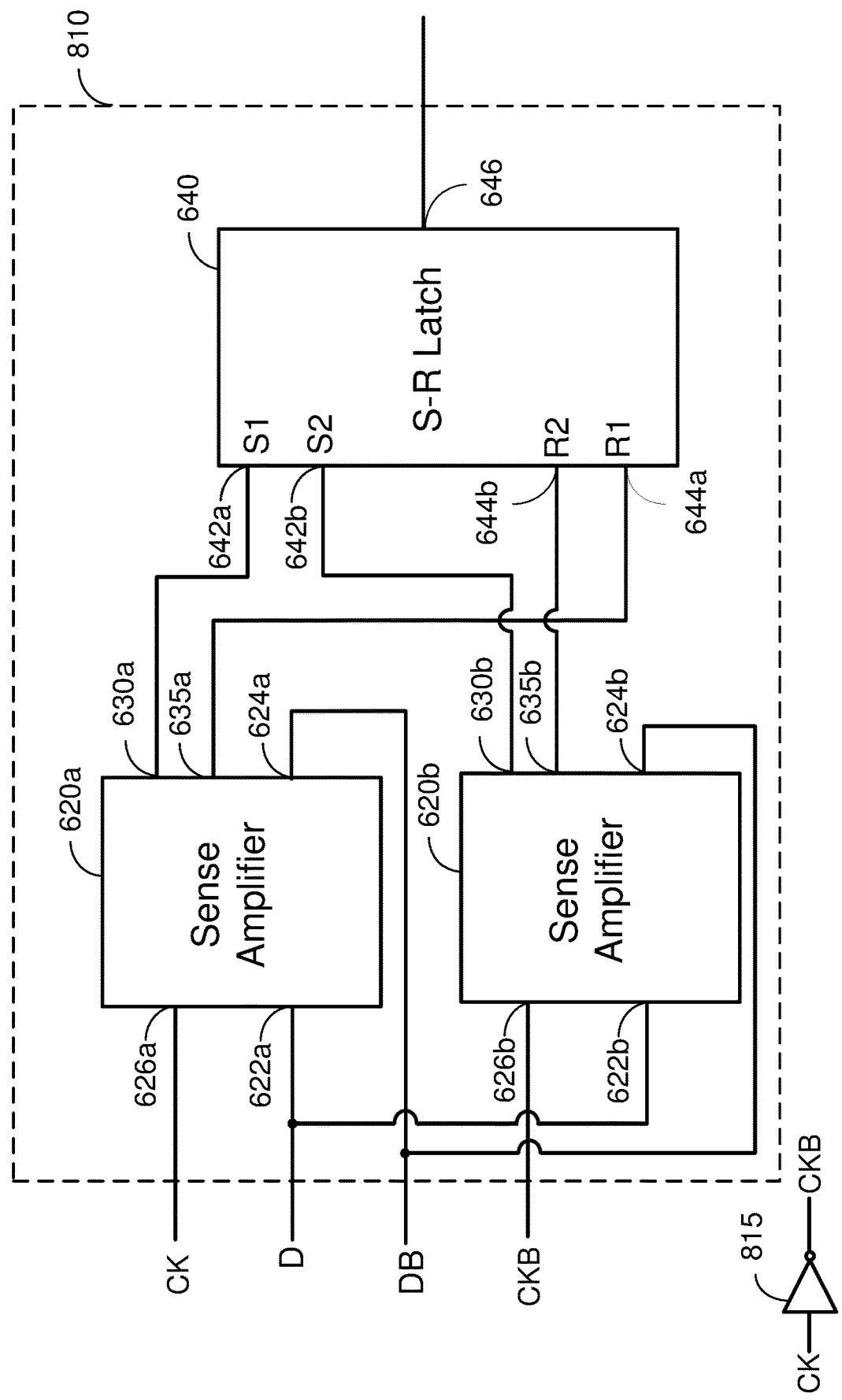
FIG. 8 shows an exemplary implementation of a dual-edge-triggered flip-flop including a first sense amplifier and a second sense amplifier according to certain aspects of the present disclosure.

FIG. 8 shows an exemplary implementation of a dual-edge-triggered flip-flop 810 according to certain aspects. The dual-edge-triggered flip-flop 810 includes a first sense amplifier 620a and a second sense amplifier 620b where each of the first sense amplifier 620a and the second sense amplifier 620b may be a separate instance (i.e., copy) of the sense amplifier 620. Thus, the above description of the sense amplifier 620 may apply to each of the sense amplifiers 620a and 620b. In FIG. 8, the letter "a" is appended to the end of the reference numbers for the first sense amplifier 620a and the letter "b" is appended to the end of the reference numbers for the second sense amplifier 620b.

In this example, the first data input 622a of the first sense amplifier 620a is coupled to the first data input 622b of the second sense amplifier 620b, and the second data input 624a of the first sense amplifier 620a is coupled to the second data input 624b of the second sense amplifier 620b. The first data input 622a of the first sense amplifier 620a and the first data input 622b of the second sense amplifier 620b are configured to receive the first data signal (labeled "D"), and the second data input 624a of the first sense amplifier 620a and the second data input 624b of the second sense amplifier 620b are configured to receive the second data signal (labeled "DB").

In this example, the clock input 626a of the first sense amplifier 620a is coupled to the clock signal CK and the clock input 626b of the second sense amplifier 620b is coupled to a second clock signal CKB. The second clock signal CKB may be the complement (i.e., inverse) of the clock signal CK. In the discussion of the dual-edge-triggered flip-flop 810 below, the clock signal CK is referred to as the first clock signal CK. In certain aspects, the second clock signal CKB may be generated from the first clock signal CK using an inverter 815. However, it is to be appreciated that the first clock signal CK and the second clock signal CKB need not be exactly complementary to each other. The first clock signal CK and the second clock signal CKB may have non-overlapping high phases so that the clock signals CK and CKB are not high at the same time. In this example, the switches of the first sense amplifier 620a are driven by the first clock signal CK, and the switches of the second sense amplifier 620b are driven by the second clock signal CKB.

The first and second clock signals CK and CKB cause the first sense amplifier 620a and the second amplifier 620b to alternately convert the first data signal and the second data signal into complementary logic values. More particularly, the first sense amplifier 620a converts the first data signal and the second data signal into complementary logic values at the outputs 630a and 635a when the first clock signal CK is high, and the second sense amplifier 620b converts the first data signal and the second data signal into complementary logic values at the outputs 630b and 635b when the first clock signal CK is low (e.g., the second clock signal CKB is high). For example, during a first portion of a cycle of the first clock signal CK, the first sense amplifier 620a may be configured to generate first complementary logic values at the outputs 630a and 635b based on the first data signal and the second data signal. During a second portion of the cycle of the first clock signal CK, the second sense amplifier 620b may be configured to generate second complementary logic values at the outputs 630b and 635b based on the first data signal and the second data signal. In this example, the first clock signal CK may be high during the first portion of the cycle of the first clock signal CK, and the first clock signal CK may be low (e.g., the second clock signal CKB may be high) during the second portion of the cycle of the first clock signal CK.

In this example, the second sense amplifier 620b may be in the pre-charge phase when the first sense amplifier 620a is in the evaluation phase, and the first sense amplifier 620a may be in the pre-charge phase when the second sense amplifier 620b is in the evaluation phase. Thus, in this example, the first sense amplifier 620a and the second sense amplifier 620b may alternate being in the pre-charge phase and alternate being in the evaluation phase.

In this example, the S-R latch 640 has a first set input 642a (labeled "S1") and a second set input 642b (labeled "S2"), in which the first set input 642a is coupled to the first output 630a of the first sense amplifier 620a and the second set input 642b is coupled to the first output 630a of the second sense amplifier 620b. The S-R latch 640 also has a first reset input 644a (labeled "R1") coupled to the second output 635a of the first sense amplifier 620a and a second reset input 644b (labeled "R2") coupled to the second output 635b of the second sense amplifier 620b.

In this example, the logic value at the output 646 of the S-R latch 640 depends on the outputs of one of the sense amplifiers 620a and 620b at a time. For example, when the first sense amplifier 620a outputs complementary logic values to the first set input 642a and the first reset input 644a of the S-R latch 640, the second sense amplifier 620b is in the pre-charge phase and outputs one to both the second set input 642b and the second reset input 644b of the S-R latch 640. In this case, the logic value at the output 646 of the S-R latch 640 is determined by the complementary logic values at the first set input 642a and the first reset input 644a. If the first set input 642a is one and the first reset input 644a is zero, then the S-R latch 640 outputs one, and, if the first set input 642a is zero and the first reset input 644a is one, then the S-R latch 640 outputs a zero.

When the second sense amplifier 620b outputs complementary logic values to the second set input 642b and the second reset input 644b of the S-R latch 640, the first sense amplifier 620a is in the pre-charge phase and outputs one to both the first set input 642a and the first reset input 644a of the S-R latch 640. In this case, the logic value at the output 646 of the S-R latch 640 is determined by the complementary logic values at the second set input 642b and the second reset input 644b. If the second set input 642b is one and the second reset input 644b is zero, then the S-R latch 640 outputs one, and, if the second set input 642b is zero and the second reset input 644b is one, then the S-R latch 640 outputs a zero.

Thus, in this example, the S-R latch 640 alternates between outputting a logic value based on the outputs 630a and 635a of the first sense amplifier 620a and a logic value based on the outputs 630b and 635b of the second sense amplifier 620b. As a result, the S-R latch 640 performs multiplexing between the outputs 630a and 635a of the first sense amplifier 620a and the outputs 630b and 635b of the second sense amplifier 620b without the need for a separate multiplexer stage driven by the first clock signal CK (e.g., the multiplexer 430 in FIG. 4). The elimination of the separate multiplexer stage reduces the number of stages in the flip-flop 810, which helps improve the speed and lower the power consumption of the flip-flop 810.

Figure 9:
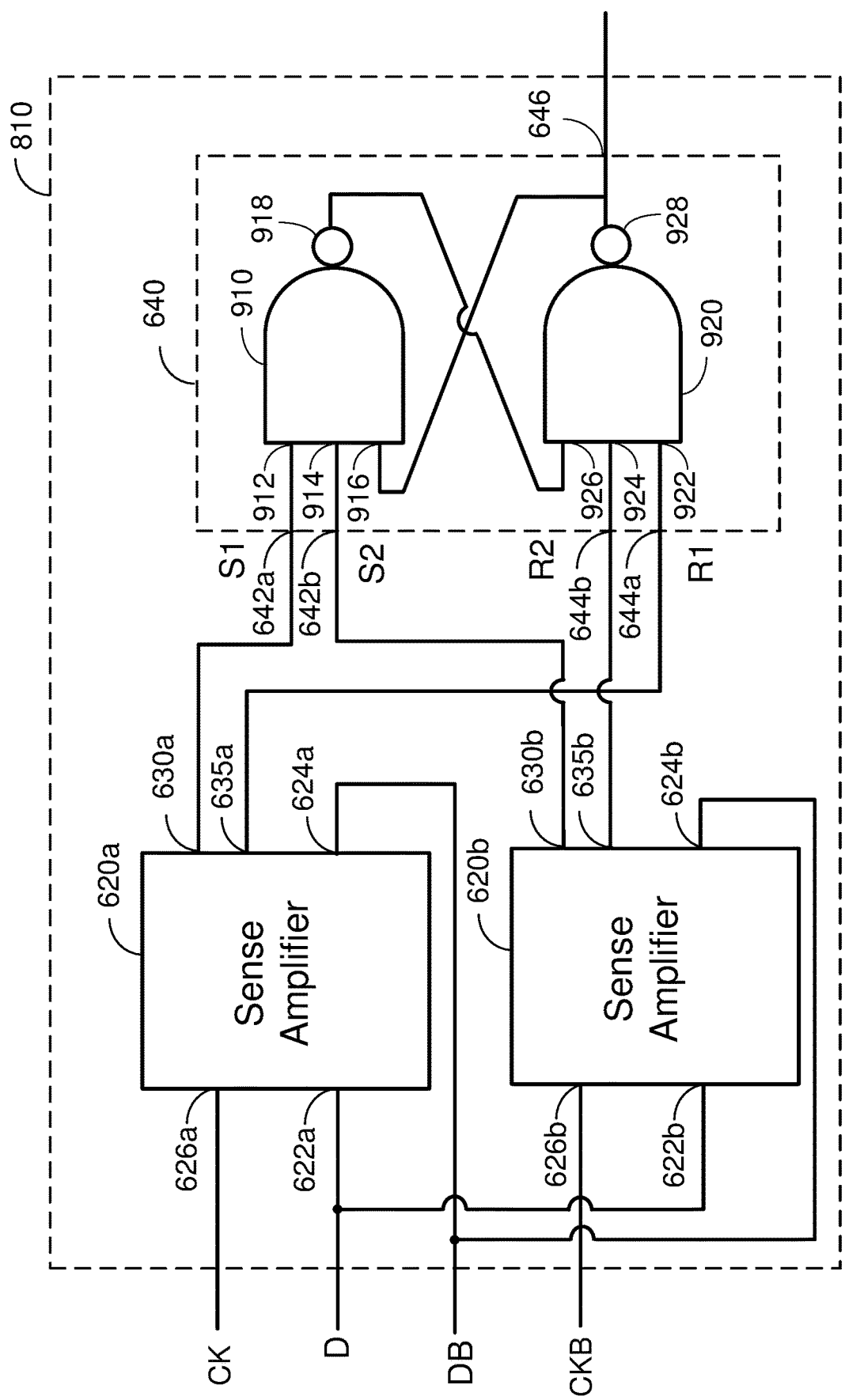
FIG. 9 shows an exemplary implementation of an S-R latch according to certain aspects of the present disclosure.

FIG. 9 shows an exemplary implementation of the S-R latch 640 for the flip-flop 810 according to certain aspects. In this example, the S-R latch 640 includes a first NAND gate 910 and a second NAND gate 920. The first NAND gate 910 has a first input 912, a second input 914, a third input 916, and an output 918. The second NAND gate 920 has a first input 922, a second input 924, a third input 926, and an output 928. The first input 912 of the first NAND gate 910 is coupled to the first set input 642a, and the second input 914 of the first NAND gate 910 is coupled to the second set input 642b. The first input 922 of the second NAND gate 920 is coupled to the first reset input 644a and the second input 924 of the second NAND gate 920 is coupled to the second reset input 644b. The output 918 of the first NAND gate 910 is coupled to the third input 926 of the second NAND gate 920, and the output 928 of the second NAND gate 920 is coupled to the third input 916 of the first NAND gate 910. In the example shown in FIG. 9, the output 928 of the second NAND gate 920 is coupled to the output 646 of the S-R latch 640. However, it is to be appreciated that the present disclosure is not limited to this example. In other implementations, the output 646 of the S-R latch 640 may be coupled to the output 918 of the first NAND gate 910.

In this example, when the second set input 642b and the second reset input 644b are both one (i.e., the second sense amplifier 620b is in the pre-charge phase), the S-R latch 640 outputs a one or a zero at the output 646 based on the logic values at the first set input 642a and the first reset input 644a. More particularly, the S-R latch 640 outputs a one when the first set input 642a is one and the first reset input 644a is zero, and outputs a zero when the first set input 642a is zero and the first reset input 644a is one. When the first set input 642a and the first reset input 644a are both one (i.e., the first sense amplifier 620a is in the pre-charge phase), the S-R latch 640 outputs a one or a zero at the output 646 based on the logic values at the second set input 642b and the second reset input 644b. More particularly, the S-R latch 640 outputs a one when the second set input 642b is one and the second reset input 644*b* is zero, and outputs a zero when the second set input 642*b* is zero and the second reset input 644*b* is one.

It is to be appreciated that the S-R latch 640 is not limited to the example implementation shown in FIG. 9. For example, it is to be appreciated that the S-R latch 640 is not limited to NAND gates and may be implemented with other types of logic gates in other implementations.

Figure 10:
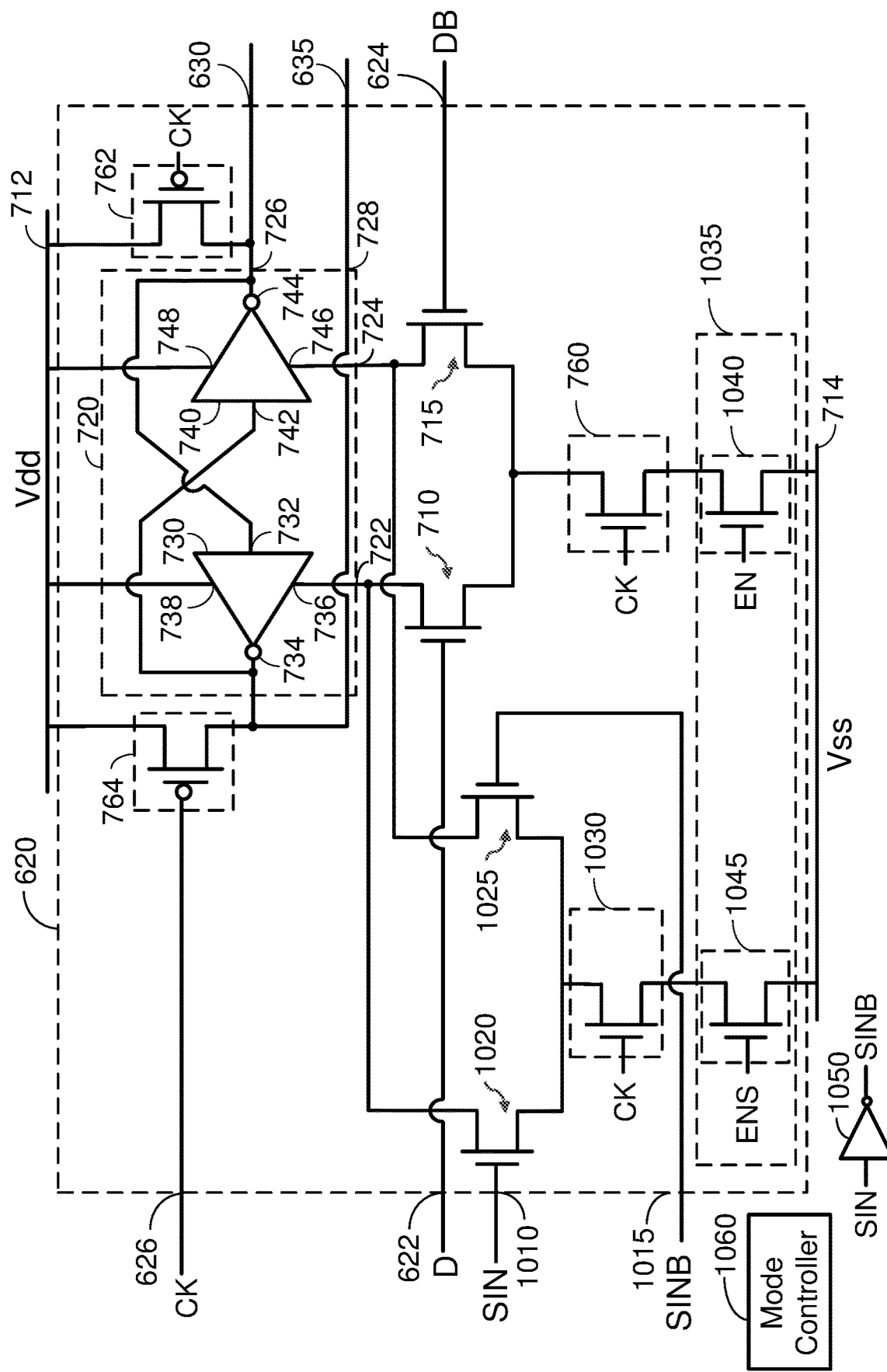
FIG. 10 shows an exemplary implementation of a sense amplifier based flip-flop including a scan input according to certain aspects of the present disclosure.

FIG. 10 shows an example in which the sense amplifier 620 supports a scan mode according to certain aspects. In this example, the sense amplifier 620 includes a third transistor 1020 and a fourth transistor 1025. The drain of the third transistor 1020 is coupled to the first input 722 of the latch 720, and the gate of the third transistor 1020 is coupled to a first scan input 1010 to receive a first scan signal (labeled "SIN"). The drain of the fourth transistor 1025 is coupled to the second input 724 of the latch 720, and the gate of the fourth transistor 1025 is coupled to a second scan input 1015 to receive a second scan signal (labeled "SINB"), which may be the complement of the first scan signal. The second scan signal may be generated from the first scan signal using an inverter 1050. As discussed further below, in the scan mode, the third transistor 1020 drives the first input 722 of the latch 720 based on the first scan signal, and the fourth transistor 1025 drives the second input 724 of the latch 720 based on the second scan signal.

In this example, the sense amplifier 620 also includes a fourth switch 1030 and an enable circuit 1035. The fourth switch 1030 is coupled to the sources of the third transistor 1020 and the fourth transistor 1025, and is driven by the clock signal CK. In the example shown in FIG. 10, the fourth switch 1030 is implemented with an NFET, in which the gate of the NFET is driven by the clock signal CK.

The enable circuit 1035 is configured to enable the first transistor 710 and the second transistor 715 and disable the third transistor 1020 and the fourth transistor 1025 in the functional mode. For example, the enable circuit 1035 may enable the first transistor 710 and second transistor 715 by coupling the first switch 760 to the low rail 714 (e.g., ground potential) and disable the third transistor 1020 and the fourth transistor 1025 by decoupling the fourth switch 1030 from the low rail 714. In the functional mode, during the evaluation phase, the first transistor 710 drives the first input 722 of the latch 720 based on the first data signal, and the second transistor 715 drives the second input 724 of the latch 720 based on the second data signal.

The enable circuit 1035 is configured to disable the first transistor 710 and the second transistor 715 and enable the third transistor 1020 and the fourth transistor 1025 in the scan mode. For example, the enable circuit 1035 may disable the first transistor 710 and second transistor 715 by decoupling the first switch 760 from the low rail 714 (e.g., ground potential) and enable the third transistor 1020 and the fourth transistor 1025 by coupling the fourth switch 1030 to the low rail 714. In the scan mode, during the evaluation phase, the third transistor 1020 drives the first input 722 of the latch 720 based on the first scan signal, and the fourth transistor 1025 drives the second input 724 of the latch 720 based on the second scan signal.

Thus, in this example, the scan inputs 1010 and 1015 and the data inputs 622 and 624 of the sense amplifier 620 are split, in which enable circuit 1035 switches the sense amplifier 620 between the functional mode and the scan mode by enabling the first and second transistors 710 and 715 coupled to the data inputs 622 and 624 in the functional mode and enabling the third and fourth transistors 1020 and 1025 coupled to the scan inputs 1010 and 1015 in the scan mode.

This allows the sense amplifier 620 to switch between the functional mode and the scan mode without the need for a separate input multiplexer stage (e.g., the multiplexer 310 in FIG. 3). The elimination of the separate multiplexer stage reduces the number of stages in the flip-flop 610, which helps improve the speed and lower the power consumption of the flip-flop 610.

In the example in FIG. 10, the enable circuit 1035 includes a first enable transistor 1040 and a second enable transistor 1045. The first enable transistor 1040 (e.g., an NFET) is coupled between the first switch 760 and the low rail 714, and the second enable transistor 1045 is coupled between the fourth switch 1030 and the low rail 714. The first enable transistor 1040 is driven by a first enable signal (labeled "EN") and the second enable transistor 1045 is driven by a second enable signal (labeled "ENS"). In some implementations, the first enable signal and the second enable signal may be complementary.

In certain aspects, the first enable signal and the second enable signal may be generated by a mode controller 1060 configured to control whether the sense amplifier 620 operates in the functional mode or the scan mode using the first enable signal and the second enable signal. For ease of illustration, the individual connections between the mode controller 1060 and the enable transistors 1040 and 1045 are not explicitly shown in FIG. 10. In this example, to operate the sense amplifier 620 in the functional mode, the mode controller 1060 turns on the first enable transistor 1040 and turns off the second enable transistor 1045 using the first enable signal and the second enable signal. To operate the sense amplifier 620 in the scan mode, the mode controller 1060 turns off the first enable transistor 1040 and turns on the second enable transistor 1045 using the first enable signal and the second enable signal.

It is to be appreciated that the enable circuit 1035 is not limited to the exemplary implementation shown in FIG. 10. For example, in other implementations, the enable circuit 1035 may be configured to disable the first transistor 710 and the second transistor 715 in the scan mode by gating the clock signal CK to the first switch 760, and disable the third transistor 1020 and the fourth transistor 1025 in the functional mode by gating the clock signal CK to the fourth switch 1030. In this example, the enable circuit 1035 passes the clock signal CK to the first transistor 710 and the second transistor 715 in the functional mode, and passes the clock signal CK to the third transistor 1020 and the fourth transistor 1025 in the scan mode.

Figure 11:
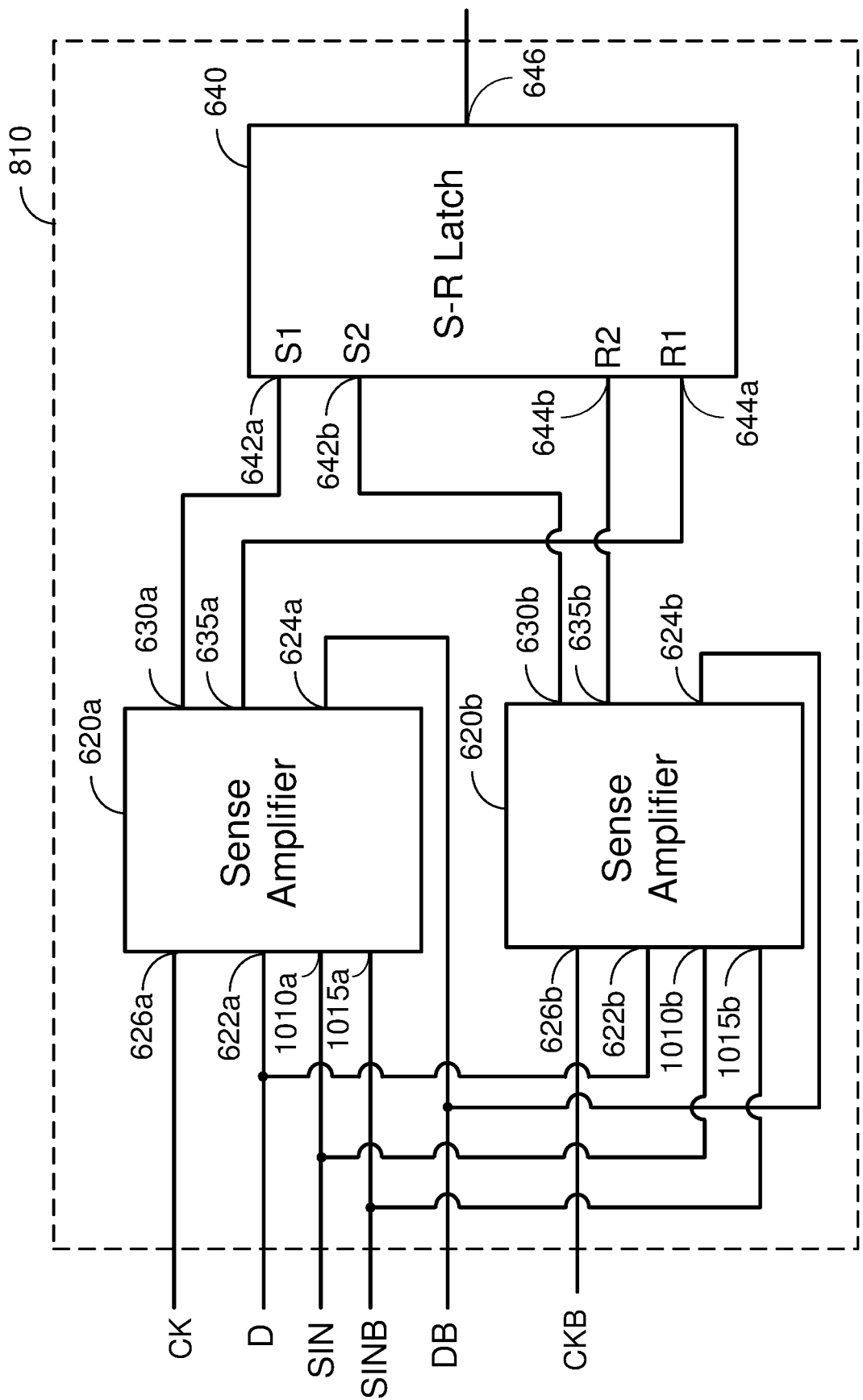
FIG. 11 shows an exemplary implementation of a dual-edge-triggered flip-flop including a scan input according to certain aspects of the present disclosure.

Multiple instances of the exemplary sense amplifier 620 shown in FIG. 10 may be used to implement a dual-edge-triggered flip-flop 810 with scan inputs. In this regard, FIG. 11 shows an exemplary implementation of the dual-edge-triggered flip-flop 810 with scan inputs according to certain aspects. In this example, the dual-edge-triggered flip-flop 810 includes a first sense amplifier 620*a* and a second sense amplifier 620*b* where each of the sense amplifier 620*a* and 620*b* may be a separate instance (i.e., copy) of the exemplary sense amplifier 620 shown in FIG. 10. Thus, the above description of the sense amplifier 620 may apply to each of the sense amplifiers 620*a* and 620*b*. In FIG. 11, the letter "a" is appended to the end of the reference numbers for the first sense amplifier 620*a* and the letter "b" is appended to the end of the reference numbers for the second sense amplifier 620*b*.

In this example, the first data input 622*a* of the first sense amplifier 620*a* is coupled to the first data input 622*b* of the second sense amplifier 620*b*, and the second data input 624*a* of the first sense amplifier 620*a* is coupled to the second data input 624b of the second sense amplifier 620b. The first data input 622a of the first sense amplifier 620a and the first data input 622b of the second sense amplifier 620b are configured to receive the first data signal (labeled "D"), and the second data input 624a of the first sense amplifier 620a and the second data input 624b of the second sense amplifier 620b are configured to receive the second data signal (labeled "DB").

The first scan input 1010a of the first sense amplifier 620a is coupled to the first scan input 1010b of the second sense amplifier 620b, and the second scan input 1015a of the first sense amplifier 620a is coupled to the second scan input 1015b of the second sense amplifier 620b. The first scan input 1010a of the first sense amplifier 620a and the first scan input 1010b of the second sense amplifier 620b are configured to receive the first scan signal (labeled "SIN"), and the second scan input 1015a of the first sense amplifier 620a and the second scan input 1015b of the second sense amplifier 620b are configured to receive the second scan signal (labeled "SINB").

The clock input 626a of the first sense amplifier 620a is configured to receive the first clock signal CK (e.g., via the clock network 120). The clock input 626b of the second sense amplifier 620b is configured to receive the second clock signal CKB, which may be generated from the first clock signal CK by the inverter 815 (shown in FIG. 8).

To operate the dual-edge-triggered flip-flop 810 in the functional mode, the mode controller 1060 (shown in FIG. 10) operates both the first sense amplifier 620a and the second sense amplifier 620b in the functional mode (e.g., using the enable signals discussed above). In the functional mode, the dual-edge-triggered flip-flop 810 may operate in the manner discussed above with reference to FIG. 8.

To operate the dual-edge-triggered flip-flop 810 in the scan mode, the mode controller 1060 (shown in FIG. 10) operates both the first sense amplifier 620a and the second sense amplifier 620b in the scan mode (e.g., using the enable signals discussed above). In the scan mode, the clock signals CK and CKB cause the first sense amplifier 620a and the second amplifier 620b to alternately convert the first scan signal and the second scan signal into complementary logic values. More particularly, the first sense amplifier 620a converts the first scan signal and the second scan signal into complementary logic values at the outputs 630a and 635a when the first clock signal CK is high, and the second sense amplifier 620b converts the first scan signal and the second scan signal into complementary logic values at the outputs 630b and 635b when the first clock signal CK is low (e.g., the second clock signal CKB is high). In this example, the S-R latch 640 outputs a logic value at the output 646 based on the complementary logic values output by the first sense amplifier 620a when the first clock signal CK is high, and outputs a logic value at the output 646 based on the complementary logic values output by the second sense amplifier 620b when the first clock signal CK is low. However, it is to be appreciated that the present disclosure is not limited to this example.

Figure 12A:
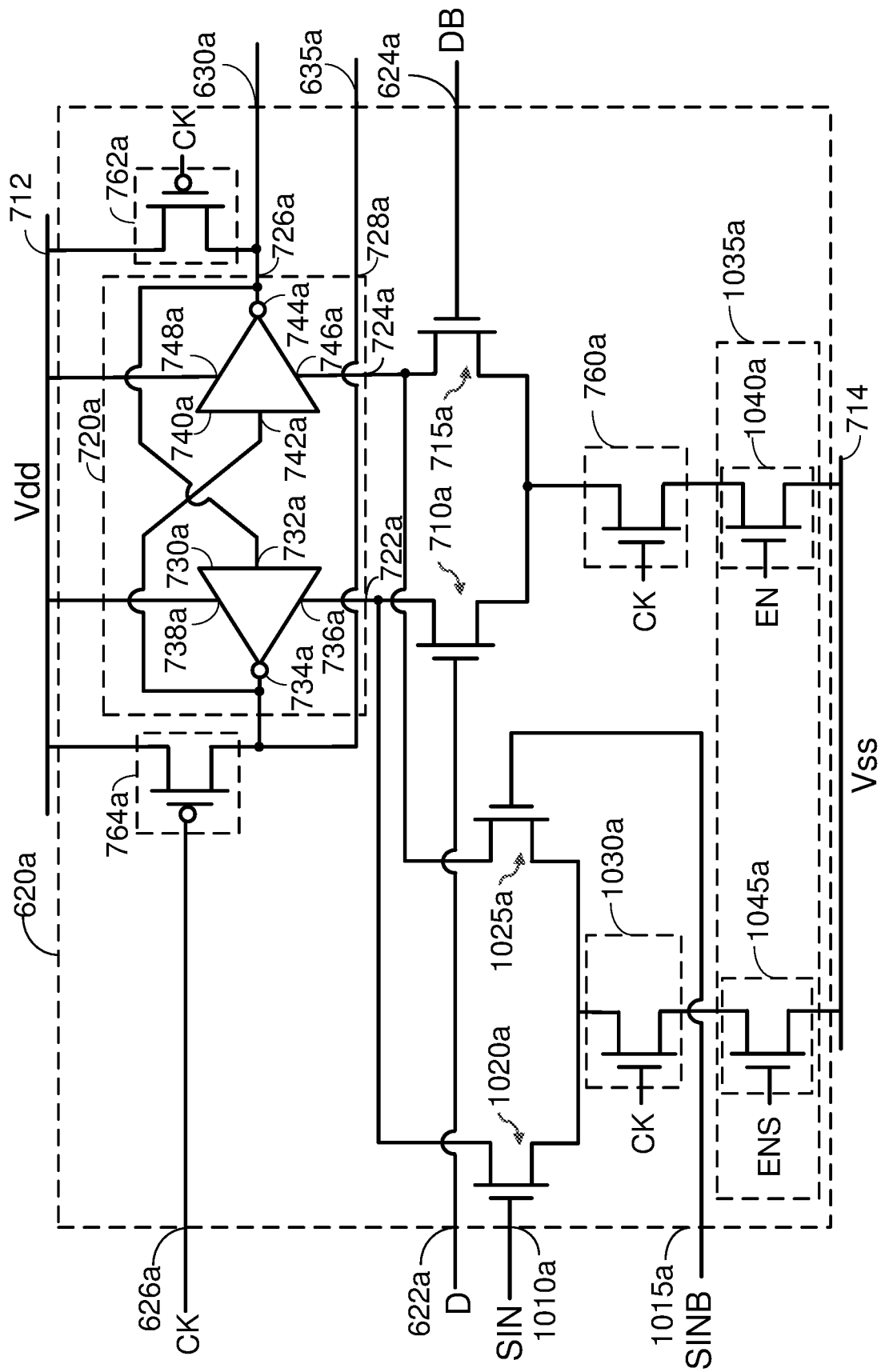
FIG. 12A shows an exemplary implementation of a first sense amplifier in the dual-edge-triggered flip-flop of FIG. 11 according to certain aspects of the present disclosure.
Figure 12B:
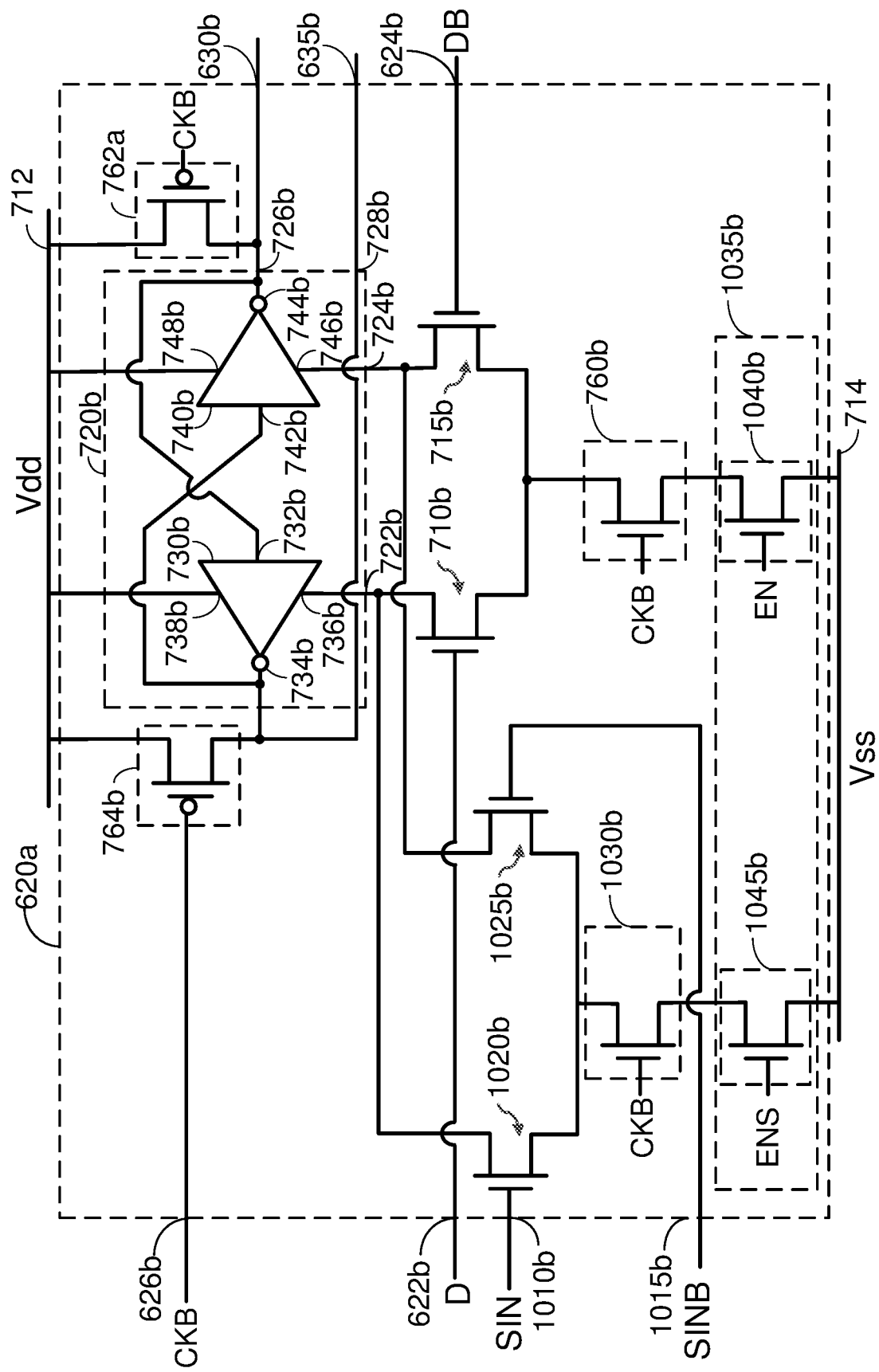
FIG. 12B shows an exemplary implementation of a second sense amplifier in the dual-edge-triggered flip-flop of FIG. 11 according to certain aspects of the present disclosure.

As discussed above, each of the sense amplifier 620a and the second sense amplifier 620b may be implemented with a separate instance (i.e., copy) of the exemplary sense amplifier 620 shown in FIG. 10. In this regard, FIG. 12A shows an example of the first sense amplifier 620a implemented with a first instance of the sense amplifier 620, in which the reference numbers for the first sense amplifier 620a are appended with the letter "a". FIG. 12B shows an example of the second sense amplifier 620b implemented with a second instance of the sense amplifier 620, in which the reference numbers for the second sense amplifier 620b are appended with the letter "b". As shown in FIGS. 12A and 12B, the switches 760a, 762a, 764a, and 1030a of the first sense amplifier 620a are driven by the first clock signal CK, and the switches 760b, 762b, 764b, and 1030b of the second sense amplifier 620b are driven by the second clock signal CKB. For implementations where the dual-edge-triggered flip-flop 810 does not support the scan mode, the third transistor 1020a, the fourth transistor 1025a, and the enable circuit 1035a in the first sense amplifier 620a may be omitted with the first switch 760a coupled to the low rail 714, and the third transistor 1020b, the fourth transistor 1025b, and the enable circuit 1035b in the second sense amplifier 620b may be omitted with the first switch 760b coupled to the low rail 714.

Figure 13A:
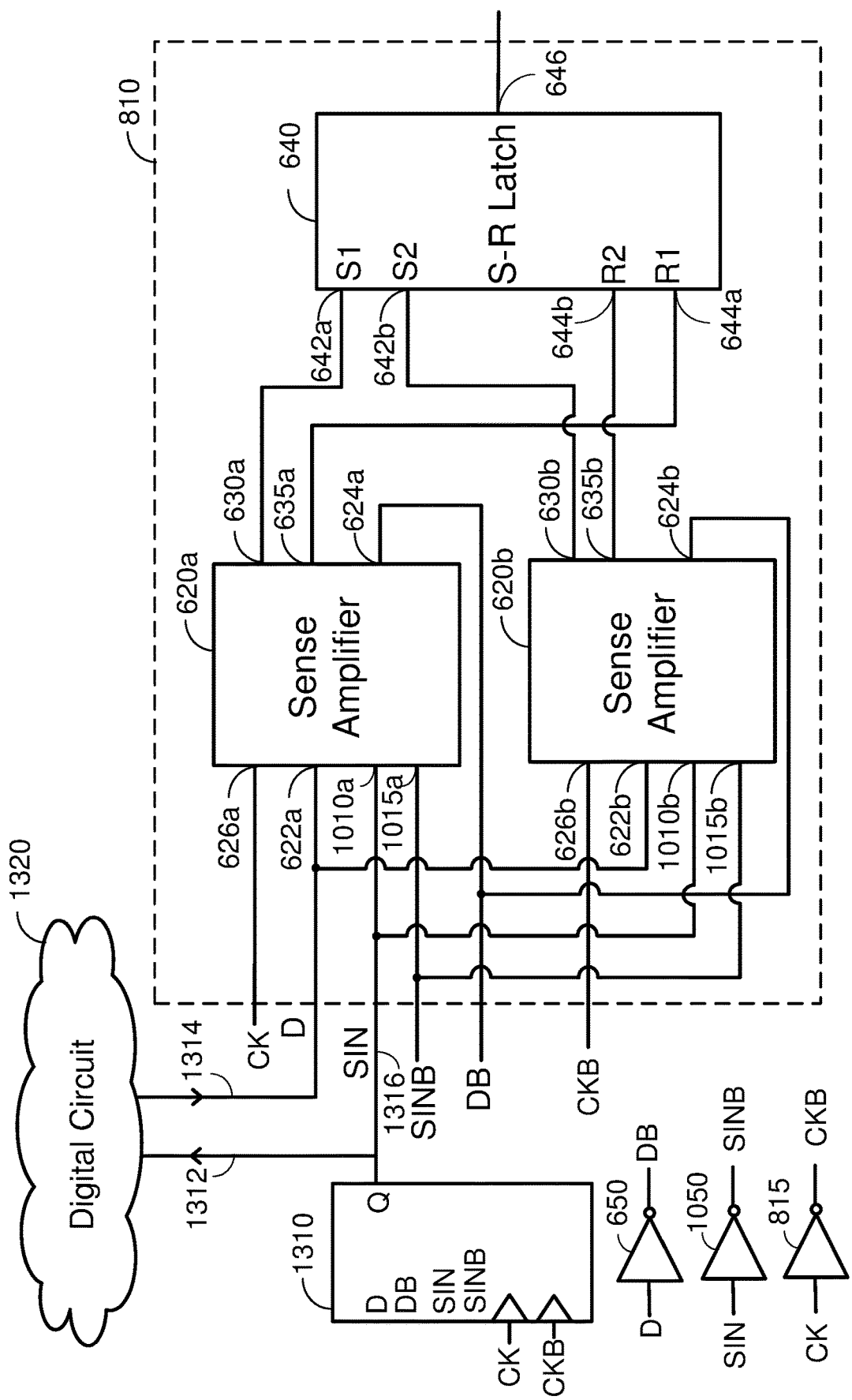
FIG. 13A shows an example of a scan flip-flop and a digital circuit according to certain aspects of the present disclosure.

FIG. 13A shows an example in which a second flip-flop 1310 and a digital circuit 1320 are coupled to the dual-edge-triggered flip-flop 810 according to certain aspects of the present disclosure. In this example, the dual-edge-triggered flip-flop 810 and the second flip-flop 1310 are part of a scan chain to support DFT, as discussed above. The digital circuit 1320 may include combinational logic and/or sequential circuits.

In this example, the second flip-flop 1310 may be a dual-edge-triggered flip-flop having data inputs (labeled "D" and "DB") coupled to a data path, and scan inputs (labeled "SIN" and "SINB") coupled to an input of the scan chain or a preceding flip-flop (not shown) in the scan chain. The second flip-flop 1310 also has an output (labeled "Q"). The second flip-flop 1310 may be implemented with a separate instance (i.e., copy) of the dual-edge-triggered flip-flop 810. However, it is to be appreciated that the present disclosure is not limited to this example. The second flip-flop 1310 may be configured to operate in the functional mode when the dual-edge-triggered flip-flop 810 is operating in the functional mode, and operate in the scan mode when the dual-edge-triggered flip-flop 810 is operating in the scan mode.

In the example shown in FIG. 13A, the output of the second flip-flop 1310 is coupled to the first scan input (labeled "SIN") of the dual-edge-triggered flip-flop 810 via a scan path 1316. The second scan input (labeled "SINB") of the dual-edge-triggered flip-flop 810 may be coupled to the scan path 1316 via the inverter 1050. The output of the second flip-flop 1310 is also coupled to the digital circuit 1320 via a first data path 1312. In this example, the digital circuit 1320 may perform logic operations on the output of the second flip-flop 1310. The digital circuit 1320 may output results of the logic operations to the first data input (labeled "D") of the dual-edge-triggered flip-flop 810 via a second data path 1314. The second data input (labeled "DB") of the dual-edge-triggered flip-flop 810 may be coupled to the second data path 1314 via the inverter 650. In this example, the dual-edge-triggered flip-flop 810 may receive the first data signal from the digital circuit 1320 in the functional mode, and may receive the first scan signal from the second flip-flop 1310 in the scan mode.

Figure 13B:
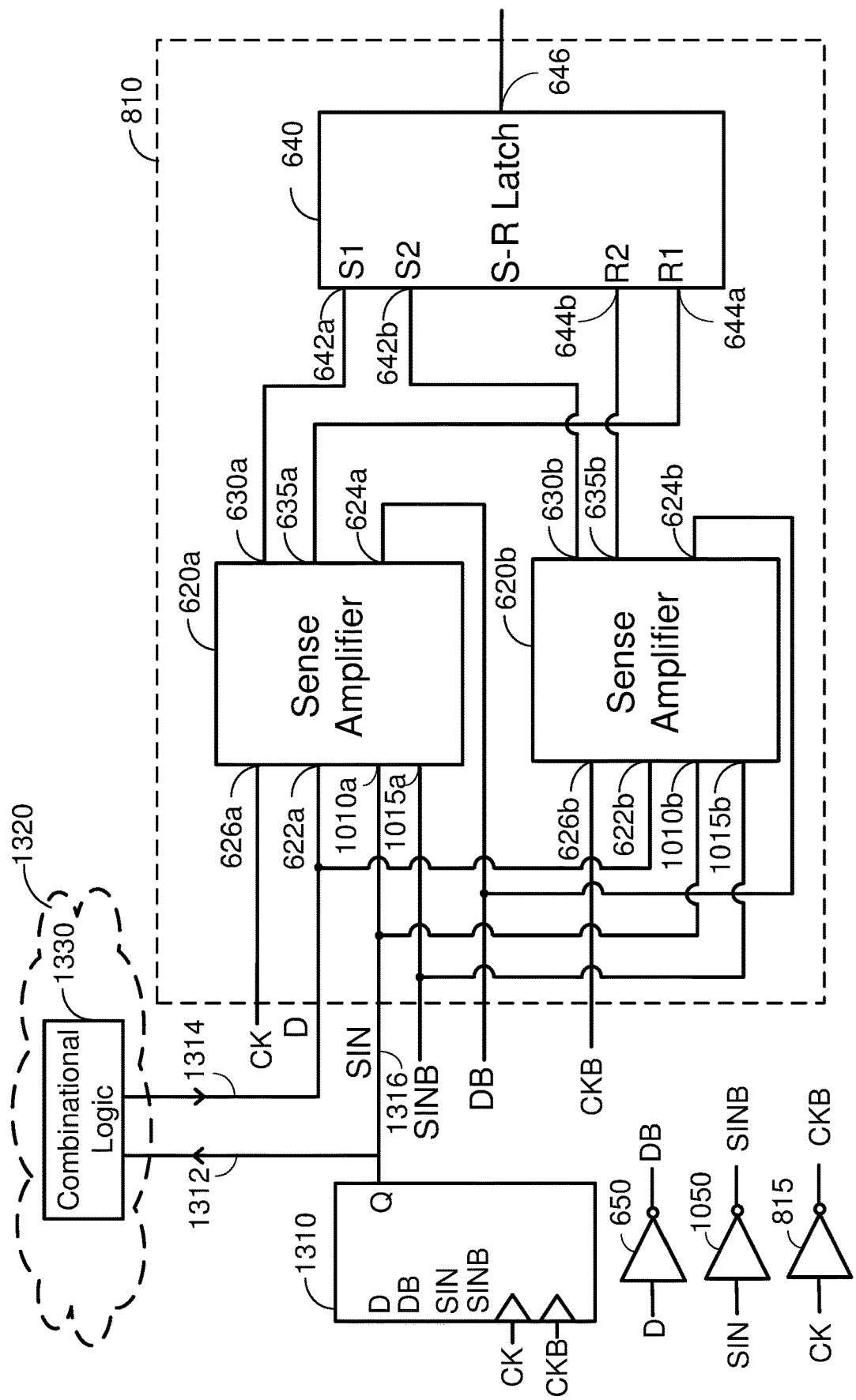
FIG. 13B shows an example in which the digital circuit of FIG. 13A includes combinational logic according to certain aspects of the present disclosure.

FIG. 13B shows an example in which the digital circuit 1320 includes combinational logic 1330 according to certain aspects. The combinational logic 1330 may include multiple logic gates coupled together to perform one or more logic operations. In this example, the first data path 1312 is coupled to the combinational logic 1330 to input data from the second flip-flop 1310 to the combinational logic 1330, and the second data path 1314 is coupled to the combinational logic 1330 to output data from the combinational logic 1330 to the first data input (labeled "D") of the dual-edge-triggered flip-flop 810.

Figure 13C:
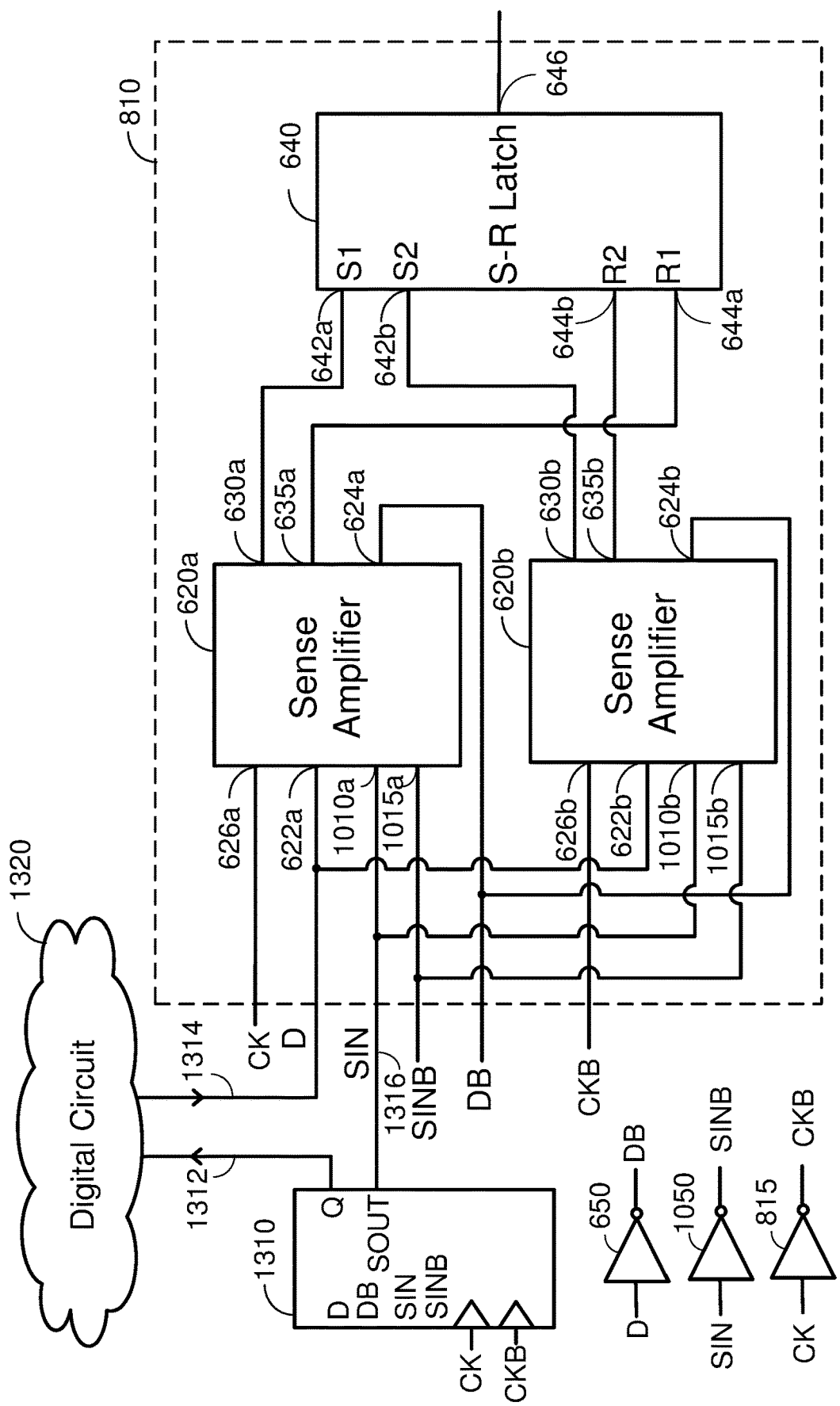
FIG. 13C shows another example of a scan flip-flop and a digital circuit according to certain aspects of the present disclosure.

FIG. 13C shows an example in which the second flip-flop 1310 has a separate scan output (labeled "SOUT") for the scan mode. The scan output may be coupled to a different internal node in the second flip-flop 1310 than the output (labeled "Q") or the two outputs may branch off from a common internal node in the second flip-flop 1310. In the example in FIG. 13B, the first scan input (labeled "SIN") of the dual-edge-triggered flip-flop 810 is coupled to the scan output of the second flip-flop 1310 via the scan path 1316. In certain aspects, the dual-edge-triggered flip-flop 810 may also have a separate scan output (not shown), which may be coupled to different node in the S-R latch 640 than the output 646 or may branch off from the same node in the S-R latch 640 as the output 646.

Figure 14:
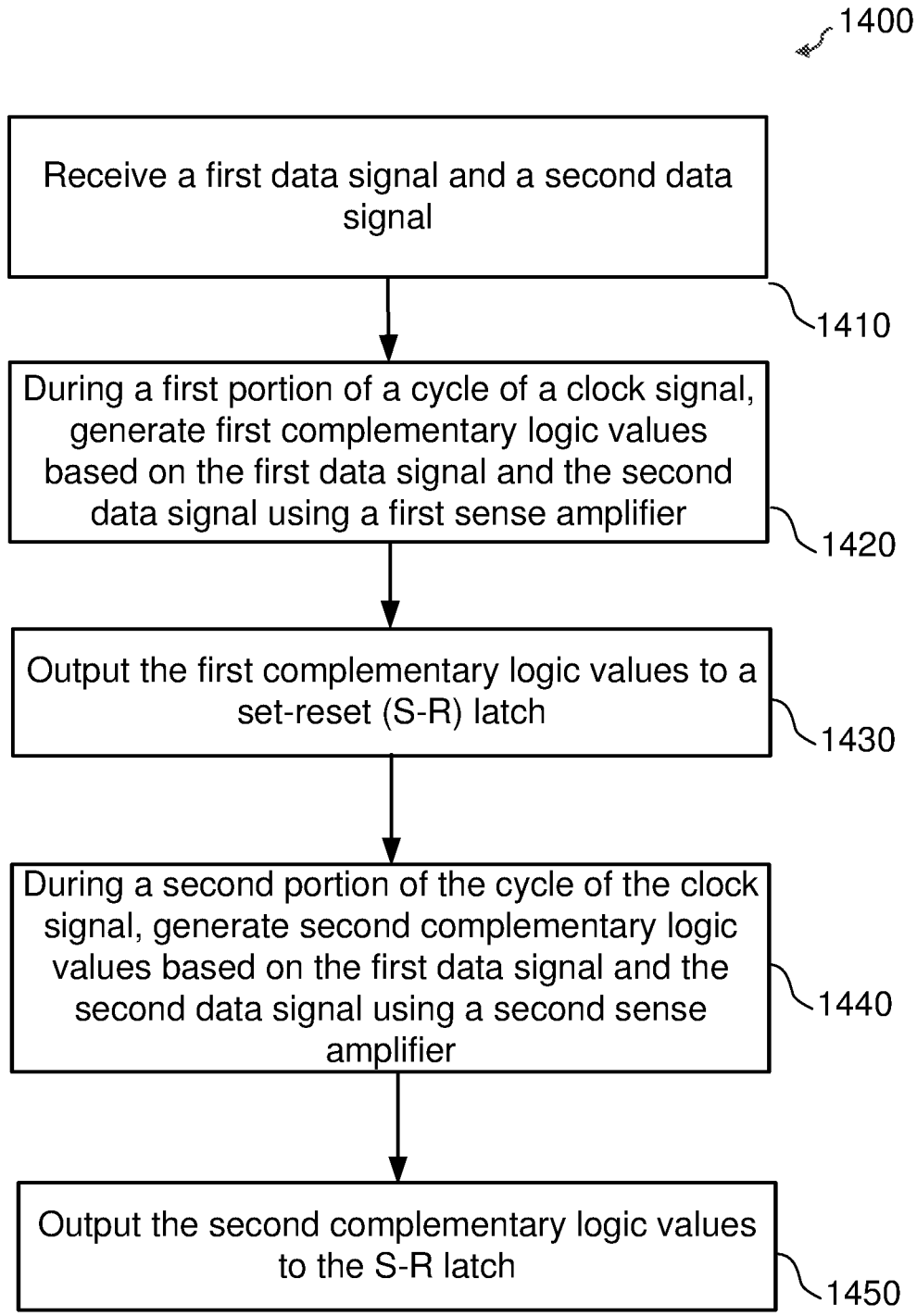
FIG. 14 is a flowchart illustrating a method of operating a dual-edge-triggered flip-flop according to certain aspects of the present disclosure.

FIG. 14 illustrates a method 1400 for operating a dual-edge-triggered flip-flop (e.g., dual edge-triggered flip-flop 810) according to certain aspects.

At block 1410, a first data signal and a second data signal are received. For example, the second data signal may be a complement of the first data signal. The first data signal may correspond to the first data signal D and the second data signal may correspond to the second data signal DB.

At block 1420, during a first portion of a cycle of a clock signal, first complementary logic values are generated based on the first data signal and the second data signal using a first sense amplifier. The first sense amplifier may correspond to the first sense amplifier 620a. The clock signal may correspond to the clock signal CK.

At block 1430, the first complementary logic values are output to a set-reset (S-R) latch. For example, the S-R latch may correspond to the S-R latch 640. In certain aspects, the first complementary logic values are output to the first set input 642a and the first reset input 644a of the S-R latch 640.

At block 1440, during a second portion of the cycle of the clock signal, second complementary logic values based on the first data signal and the second data signal using a second sense amplifier. The second sense amplifier may correspond to the second sense amplifier 620b. In certain aspects, the clock signal CK is high during the first portion of the cycle of the clock signal CK and low during the second portion of the cycle of the clock signal CK.

At block 1450, the second complementary logic values are output to the S-R latch. In certain aspects, the second complementary logic values are output to the second set input 642b and the second reset input 644b of the S-R latch 640.

The mode controller 1060 may be implemented with a general-purpose processor, a digital signal processor (DSP), an application specific integrated circuit (ASIC), a field programmable gate array (FPGA) or other programmable logic device, discrete hardware components (e.g., logic gates), a state machine, or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Implementation examples are described in the following numbered clauses:

1. A system, comprising:
    a first sense amplifier having a first data input, a second data input, a clock input, a first output, and a second output, wherein the clock input of the first sense amplifier is configured to receive a first clock signal;
    a second sense amplifier having a first data input, a second data input, a clock input, a first output, and a second output, wherein the clock input of the second sense amplifier is configured to receive a second clock signal, the first data input of the second sense amplifier is coupled to the first data input of the first sense amplifier, and the second data input of the second sense amplifier is coupled to the second data input of the first sense amplifier; and
    a set-reset (S-R) latch having a first set input, a second set input, a first reset input, a second reset input, and an output, wherein the first set input is coupled to the first output of the first sense amplifier, the second set input is coupled to the first output of the second sense amplifier, the first reset input is coupled to the second output of the first sense amplifier, and the second reset input is coupled to the second output of the second sense amplifier.

2. The system of clause 1, wherein the first data input of the first sense amplifier is configured to receive a first data signal, and the second data input of the first sense amplifier is configured to receive a second data signal.

3. The system of clause 2, wherein the second data signal is a complement of the first data signal.

4. The system of any one of clauses 1 to 3, wherein the first sense amplifier comprises:
    a latch having a first input, a second input, a first output, and a second output, wherein the first output of the latch is coupled to the first output of the first sense amplifier, and the second output of the latch is coupled to the second output of the first sense amplifier;
    a first transistor, wherein a gate of the first transistor is coupled to the first data input of the first sense amplifier, and a drain of the first transistor is coupled to the first input of the latch; and
    a second transistor, wherein a gate of the second transistor is coupled to the second data input of the first sense amplifier, and a drain of the second transistor is coupled to the second input of the latch.

5. The system of clause 4, wherein the first sense amplifier further comprises:
    a first switch coupled between a source of the first transistor and a low rail, and coupled between a source of the second transistor and the low rail;
    a second switch coupled between the first output of the latch and a supply rail; and
    a third switch coupled between the second output of the latch and the supply rail, wherein each of the first switch, the second switch, and the third switch is driven by the first clock signal.

6. The system of clause 5, wherein the first switch comprises an n-type field effect transistor (NFET), the second switch comprises a first p-type field effect transistor (PFET), and the third switch comprises a second PFET.

7. The system of clause 5 or 6, wherein the low rail is coupled to a ground potential.

8. The system of any one of clauses 4 to 7, wherein the latch comprises a first inverter and a second inverter, and the first inverter and the second inverter are cross coupled.

9. The system of any one of clauses 2 to 8, wherein:
    the first sense amplifier is configured to generate first complementary logic values at the first output of the first sense amplifier and the second output of the first sense amplifier based on the first data signal and the second data signal during a first portion of a cycle of the first clock signal; and
    the second sense amplifier is configured to generate second complementary logic values at the first output of the second sense amplifier and the second output of the second sense amplifier based on the first data signal and the second data signal during a second portion of the cycle of the first clock signal.

10. The system of clause 9, wherein the first clock signal is high during the first portion of the cycle of the first clock signal, and the first clock signal is low during the second portion of the cycle of the first clock signal.

11. The system of clause 10, wherein the second clock signal is a complement of the first clock signal.

12. The system of any one of clauses 1 to 11, wherein the S-R latch comprises:
a first NAND gate having a first input, a second input, a third input, and an output, wherein the first input of the first NAND gate is coupled to the first set input, and the second input of the first NAND gate is coupled to the second set input; and a second NAND gate having a first input, a second input, a third input, and an output, wherein the first input of the second NAND gate is coupled to the first reset input, the second input of the second NAND gate is coupled to the second reset input, the third input of the second NAND gate is coupled to the output of the first NAND gate, and the output of the second NAND gate is coupled to the third input of the first NAND gate.

13. The system of clause 12, wherein the output of the S-R latch is coupled to the output of the first NAND gate or the output of the second NAND gate.

14. A method, comprising:
receiving a first data signal and a second data signal;
during a first portion of a cycle of a clock signal, generating first complementary logic values based on the first data signal and the second data signal using a first sense amplifier;
outputting the first complementary logic values to a set-reset (S-R) latch;
during a second portion of the cycle of the clock signal, generating second complementary logic values based on the first data signal and the second data signal using a second sense amplifier; and
outputting the second complementary logic values to the S-R latch.

15. The method of clause 14, wherein the second data signal is a complement of the first data signal.

16. The method of clause 14 or 15, wherein:
outputting the first complementary logic values to the S-R latch comprises outputting the first complementary logic values to a first set input and a first reset input of the S-R latch; and
outputting the second complementary logic values to the S-R latch comprises outputting the second complementary logic values to a second set input and a second reset input of the S-R latch.

17. The method of any one of clauses 14 to 16, wherein the clock signal is high during the first portion of the cycle of the clock signal, and the clock signal is low during the second portion of the cycle of the clock signal.

18. A system, comprising:
a sense amplifier having a first data input, a second data input, a first scan input, and second scan input, wherein the sense amplifier comprises:
a latch having a first input, a second input, a first output, and a second output;
a first transistor, wherein a gate of the first transistor is coupled to the first data input of the sense amplifier, and a drain of the first transistor is coupled to the first input of the latch;
a second transistor, wherein a gate of the second transistor is coupled to the second data input of the sense amplifier, and a drain of the second transistor is coupled to the second input of the latch;
a third transistor, wherein a gate of the third transistor is coupled to the first scan input of the sense amplifier, and a drain of the third transistor is coupled to the first input of the latch; and
a fourth transistor, wherein a gate of the fourth transistor is coupled to the second can input of the sense amplifier, and a drain of the fourth transistor is coupled to the second input of the latch; and
a set-reset (S-R) latch having a set input, a reset input, and an output, wherein the set input is coupled to the first output of the latch, and the reset input is coupled to the second output of the latch.

19. The system of clause 18, wherein the sense amplifier further comprises:
an enable circuit;
a first switch coupled to a source of the first transistor and a source of the second transistor, wherein the enable circuit is configured to couple the first switch to a low rail in a functional mode, and decouple the first switch from the low rail in a scan mode;
a second switch coupled between the first output of the latch and a supply rail;
a third switch coupled between the second output of the latch and the supply rail; and
a fourth switch coupled to a source of the third transistor and a source of the fourth transistor, wherein the enable circuit is configured to couple the fourth switch to the low rail in the scan mode, and decouple the fourth switch from the low rail in the functional mode.

20. The system of clause 19, wherein each of the first switch, the second switch, the third switch, and the fourth switch is driven by a clock signal.

21. The system of clause 19 or 20, wherein the first switch comprises a first n-type field effect transistor (NFET), the second switch comprises a first p-type field effect transistor (PFET), the third switch comprises a second PFET, and the fourth switch comprises a second NFET.

22. The system of any one of clauses 19 to 21, wherein the low rail is coupled to a ground potential.

23. The system of any one of clauses 18 to 22, wherein the latch comprises a first inverter and a second inverter, and the first inverter and the second inverter are cross coupled.

24. The system of any one of clauses 18 to 23, wherein the first data input is coupled to combinational logic, and the first scan input is coupled to an output of a scan flip-flop.

25. The system of clause 24, wherein the second data input is coupled to the combinational logic via a first inverter, and the second scan input is coupled to the output of the scan flip-flop via a second inverter.

26. The system of any one of clauses 18 to 25, wherein the S-R latch comprises:
a first NAND gate having a first input, a second input, and an output, wherein the first input of the first NAND gate is coupled to the set input; and
a second NAND gate having a first input, a second input, and an output, wherein the first input of the second NAND gate is coupled to the reset input, the second input of the second NAND gate is coupled to the output of the first NAND gate, and the output of the second NAND gate is coupled to the second input of the first NAND gate.

27. The system of clause 26, wherein the output of the S-R latch is coupled to the output of the first NAND gate or the output of the second NAND gate.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
   a first sense amplifier having a first data input, a second data input, a clock input, a first output, and a second output, wherein the clock input of the first sense amplifier is configured to receive a first clock signal, the first data input of the first sense amplifier is configured to receive a first data signal, and the second data input of the first sense amplifier is configured to receive a second data signal;
   a second sense amplifier having a first data input, a second data input, a clock input, a first output, and a second output, wherein the clock input of the second sense amplifier is configured to receive a second clock signal, the first data input of the second sense amplifier is coupled to the first data input of the first sense amplifier, and the second data input of the second sense amplifier is coupled to the second data input of the first sense amplifier; and
   a set-reset (S-R) latch having a first set input, a second set input, a first reset input, a second reset input, and an output, wherein the first set input is coupled to the first output of the first sense amplifier, the second set input is coupled to the first output of the second sense amplifier, the first reset input is coupled to the second output of the first sense amplifier, and the second reset input is coupled to the second output of the second sense amplifier;
   wherein the first sense amplifier is configured to generate first complementary logic values at the first output of the first sense amplifier and the second output of the first sense amplifier based on the first data signal and the second data signal during a first portion of a cycle of the first clock signal;
   wherein the second sense amplifier is configured to generate second complementary logic values at the first output of the second sense amplifier and the second output of the second sense amplifier based on the first data signal and the second data signal during a second portion of the cycle of the first clock signal; and
   wherein the first clock signal is high during the first portion of the cycle of the first clock signal, and the first clock signal is low during the second portion of the cycle of the first clock signal.

2. The system of claim 1, wherein the second data signal is a complement of the first data signal.

3. The system of claim 1, wherein the first sense amplifier comprises:
   a latch having a first input, a second input, a first output, and a second output, wherein the first output of the latch is coupled to the first output of the first sense amplifier, and the second output of the latch is coupled to the second output of the first sense amplifier;
   a first transistor, wherein a gate of the first transistor is coupled to the first data input of the first sense amplifier, and a drain of the first transistor is coupled to the first input of the latch; and
   a second transistor, wherein a gate of the second transistor is coupled to the second data input of the first sense amplifier, and a drain of the second transistor is coupled to the second input of the latch.

4. The system of claim 3, wherein the first sense amplifier further comprises:
   a first switch coupled between a source of the first transistor and a low rail, and coupled between a source of the second transistor and the low rail;
   a second switch coupled between the first output of the latch and a supply rail; and
   a third switch coupled between the second output of the latch and the supply rail, wherein each of the first switch, the second switch, and the third switch is driven by the first clock signal.

5. The system of claim 4, wherein the first switch comprises an n-type field effect transistor (NFET), the second switch comprises a first p-type field effect transistor (PFET), and the third switch comprises a second PFET.

6. The system of claim 3, wherein the latch comprises a first inverter and a second inverter, and the first inverter and the second inverter are cross coupled.

7. The system of claim 1, wherein the S-R latch comprises:
   a first NAND gate having a first input, a second input, a third input, and an output, wherein the first input of the first NAND gate is coupled to the first set input, and the second input of the first NAND gate is coupled to the second set input; and
   a second NAND gate having a first input, a second input, a third input, and an output, wherein the first input of the second NAND gate is coupled to the first reset input, the second input of the second NAND gate is coupled to the second reset input, the third input of the second NAND gate is coupled to the output of the first NAND gate, and the output of the second NAND gate is coupled to the third input of the first NAND gate.

8. The system of claim 7, wherein the output of the S-R latch is coupled to the output of the first NAND gate or the output of the second NAND gate.

9. The system of claim 1, wherein:
   the first sense amplifier is configured to output one to both the first set input and the first reset input of the S-R latch when the second sense amplifier generates the second complementary logic values; and
   the second sense amplifier is configured to output one to both the second set input and the second reset input of the S-R latch when the first sense amplifier generates the first complementary logic values.

10. The system of claim 1, wherein the second sense amplifier is configured to generate the second complementary logic values at the first output of the second sense amplifier and the second output of the second sense amplifier based on the first data signal and the second data signal when the second clock signal is high, and the first clock signal and the second clock signal have non-overlapping high phases.

11. The system of claim 1, wherein the first clock signal signal is a complement of the second clock signal.

12. A method, comprising:
- receiving a first data signal and a second data signal;
- during a first portion of a cycle of a clock signal, generating first complementary logic values based on the first data signal and the second data signal using a first sense amplifier;
- outputting the first complementary logic values to a set-reset (S-R) latch;
- during a second portion of the cycle of the clock signal, generating second complementary logic values based on the first data signal and the second data signal using a second sense amplifier, wherein the clock signal is high during the first portion of the cycle of the clock signal, and the clock signal is low during the second portion of the cycle of the clock signal; and
- outputting the second complementary logic values to the S-R latch.

13. The method of claim 12, wherein the second data signal is a complement of the first data signal.

14. The method of claim 12, wherein:
- outputting the first complementary logic values to the set-reset (S-R) latch comprises outputting the first complementary logic values to a first set input and a first reset input of the S-R latch; and
- outputting the second complementary logic values to the S-R latch comprises outputting the second complementary logic values to a second set input and a second reset input of the S-R latch.

15. The method of claim 14, further comprising:
- outputting one to both the second set input and the second reset input of the S-R latch during the first portion of the cycle of the clock signal; and
- outputting one to both the first set input and the first reset input of the S-R latch during the second portion of the cycle of the clock signal.

* * * * *